(12) United States Patent
Kubota et al.

(10) Patent No.: US 9,164,601 B2
(45) Date of Patent: Oct. 20, 2015

(54) ELECTRO-OPTICAL DEVICE AND ELECTRONIC APPARATUS

(71) Applicant: SEIKO EPSON CORPORATION, Tokyo (JP)

(72) Inventors: Takehiko Kubota, Matsumoto (JP); Takeshi Nomura, Shiojiri (JP); Hitoshi Ota, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 319 days.

(21) Appl. No.: 13/665,275

(22) Filed: Oct. 31, 2012

(65) Prior Publication Data

US 2013/0120338 A1    May 16, 2013

(30) Foreign Application Priority Data

Nov. 10, 2011   (JP) ................................ 2011-246420

(51) Int. Cl.
  *G09G 3/30*   (2006.01)
  *G06F 3/038*   (2013.01)
  *G09G 3/32*   (2006.01)
(52) U.S. Cl.
  CPC .............. *G06F 3/038* (2013.01); *G09G 3/3233* (2013.01); *G09G 2300/0861* (2013.01)
(58) Field of Classification Search
  CPC ............. G09G 3/10; G09G 3/30; G09G 5/00; G06F 3/038
  USPC ......................... 345/76, 98, 99, 100, 204, 211; 315/169.3; 313/500, 504; 257/88
  See application file for complete search history.

(56) References Cited

U.S. PATENT DOCUMENTS

| | | | |
|---|---|---|---|
| 2004/0012548 A1 | 1/2004 | Anzai | |
| 2006/0267491 A1 | 11/2006 | Koo et al. | |
| 2007/0131936 A1* | 6/2007 | Kang et al. | 257/72 |
| 2007/0273619 A1 | 11/2007 | Kitazawa et al. | |
| 2008/0239183 A1* | 10/2008 | Luo et al. | 349/39 |
| 2009/0206737 A1* | 8/2009 | Liu et al. | 313/504 |
| 2010/0072478 A1 | 3/2010 | Koo et al. | |
| 2010/0225839 A1* | 9/2010 | Kim et al. | 349/38 |

FOREIGN PATENT DOCUMENTS

| | | |
|---|---|---|
| JP | 2003-323133 A | 11/2003 |
| JP | 2006-243176 A | 9/2006 |
| JP | 2006-330736 A | 12/2006 |
| JP | A-2007-316462 | 12/2007 |
| JP | 2009-200336 A | 9/2009 |
| JP | A-2009-288435 | 12/2009 |

* cited by examiner

*Primary Examiner* — Pegeman Karimi
(74) *Attorney, Agent, or Firm* — Oliff PLC

(57) ABSTRACT

An electro-optical device comprises a substrate, a scanning line, a data line, a pixel circuit, and a first storage capacitor holding a first voltage corresponding to a data signal. The first storage capacitor includes a first portion and a second portion connected in parallel. The first portion and the second portion overlap when viewed from a direction orthogonal with respect to the first main surface.

19 Claims, 15 Drawing Sheets

<(a) LIGHT EMITTING PERIOD>

<(c) COMPENSATION PERIOD>

<(d) WRITING PERIOD>

ELECTRO-OPTICAL DEVICE AND ELECTRONIC APPARATUS

BACKGROUND

1. Technical Field

The present invention relates to an electro-optical device and an electronic apparatus useful when miniaturizing a pixel circuit, for example.

2. Related Art

In recent years, various types of electro-optical devices using light-emitting elements such as organic light-emitting diodes (below, "OLED") have been proposed. In such electro-optical devices, pixel circuits including the above-described light-emitting elements, transistors, and the like corresponding to intersections of scanning lines and data lines are generally configured to be provided corresponding to the pixels of the image to be displayed. In such a configuration, when a data signal of a potential according to the gradation level of the pixels is applied to the gate of the transistor, the transistor supplies current according to the voltage between the gate and the source to the light-emitting element. In this manner, the light-emitting element emits light with a luminance according to the gradation level. At this time, if the characteristics of the threshold voltages or the like of the transistors are varied for each pixel circuit, display unevenness adversely affecting the uniformity of the display screen is generated. For this reason, techniques compensating for the characteristics of the transistors have been proposed (for example, refer to JP-A-2007-316462).

Further, with respect to electro-optical devices, there is great demand for reduction of the display size and an increase in the high definition of the display. In order to achieve both reduction of the display size and an increase in the high definition of the display, since there is a need to miniaturize the pixel circuit, a technique providing the electro-optical device on a silicon integrated circuit, for example, has also been proposed (for example, refer to JP-A-2009-288435).

Here, when the pixel circuit is miniaturized, it is necessary to control the current supplied to the light-emitting element within a micro region. The current supplied to the light-emitting element is controlled according to the voltage between the gate and the source of the transistor; however, in the micro region, the current supplied to the light-emitting element changes greatly with respect to slight changes in the voltage between the gate and the source.

Meanwhile, the driving capability of the circuit outputting the data signal is increased in order to charge the data lines in a short time. In a circuit having a high driving capability in this manner, it is difficult to output the data signal with extremely fine precision.

Here, in a case where it is intended to compress the amplitude of the data signal and perform supply thereof to the gate of the transistor using some kind of configuration, there is a problem in that it is difficult to narrow the pitch of the data lines due to the incorporation of such a configuration.

SUMMARY

An advantage of some aspects of the invention is that it provides an electro-optical device and an electronic apparatus capable of narrowing the pitch of data lines while continuing to compress the amplitude of data signals.

According to an aspect of the invention, there is provided an electro-optical device including: a substrate; a scanning line provided on an upper side of a first main surface of the substrate; a data line provided on the upper side of the first main surface; a pixel circuit provided corresponding to an intersection of the scanning line and the data line; and a first storage capacitor holding a first voltage corresponding to a data signal, in which the first storage capacitor includes a first portion and a second portion connected in parallel, and in which the first portion and the second portion overlap when viewed from a direction orthogonal with respect to the first main surface.

According to the aspect of the invention, since the first storage capacitor includes the first portion and the second portion connected in parallel and these are arranged so as to overlap when viewed from a direction orthogonal with respect to the first main surface, it is possible to obtain a large capacitance value in a small area. As a result, it is possible to increase the ratio of the area of the substrate occupied by the pixel circuit.

Here, "the first portion and the second portion are overlapped" may mean that all of the first portion is overlapped with the second portion, that all of the second portion is overlapped with the first portion, or that a part of the first portion and a part of the second portion are overlapped.

In the above-described electro-optical device, it is preferable that the pixel circuit include a pixel capacitor holding a second voltage according to the data signal, and that the second voltage be generated based on the first voltage.

In addition, in the above-described electro-optical device, it is preferable that, when the difference between the lowest voltage value and the highest voltage value of the first voltage is set as a first voltage difference and the difference between the lowest voltage value and the highest voltage value of the second voltage is set as a second voltage difference, the second voltage difference be smaller than the first voltage difference.

In addition, it is preferable that the above-described electro-optical device further include a second storage capacitor of which one end is connected to the data line, and that the second voltage be generated by level shifting using the second storage capacitor.

In addition, in the above-described electro-optical device, it is preferable that the second storage capacitor include a first capacitor electrode and a second capacitor electrode, that the first capacitor electrode and one end of the first storage capacitor be electrically connected at least in a first period, and that the second capacitor electrode be connected to the data line.

In addition, it is preferable that the above-described electro-optical device further include a third storage capacitor having one end is connected to the data line, that the second storage capacitor be connected in series to the first storage capacitor through a first switch, and that the second voltage be level-shifted and generated based on the capacitance ratio of at least the second storage capacitor and the third storage capacitor.

In addition, it is preferable that the above-described electro-optical device include a level shift circuit including the first storage capacitor, the second storage capacitor, and the first switch, and driving the data line, in which the pixel circuit includes a first transistor supplying current according to the voltage between the gate and the source and a light-emitting element emitting light at a luminance according to the current supplied from the first transistor, in which the first transistor and the light-emitting element are connected in series between a power source of a high order side and a power source of a low order side, and in which, when viewed from a direction orthogonal with respect to the first main surface, a common wiring electrically connected to the power source of the high order side or the power source of the low order side is formed so as to cover the level shift circuit, and one electrode of the second portion and the common wiring are electrically connected.

According to the aspect of the invention, since the driving circuit is covered by the common wiring, it is possible to prevent erroneous operation caused by external light incident to the level shift circuit. Further, since one electrode of the second portion and the common wiring are electrically connected, there is no need to provide a separate light blocking layer in order to block light for the circuit formed in the lower layer of the first storage capacitor. Moreover, since the common wiring is formed with a large area so as to cover the level shift circuit, the impedance thereof can be reduced, whereby it is possible to reduce the impedance of the power source of the high order side or the power source of the low order side connected to the common wiring. In addition, since the data signal is held in the first storage capacitor but the common wiring also functions as a shield, there is an advantage in that it is possible to inhibit the influence of noise coming in from the control circuit or the like.

In addition, it is preferable that the above-described electro-optical device include a second switch having an input end and an output end connected to one end of the first storage capacitor, in which the data signal is supplied to the input end of the second switch, in which, when viewed from a direction orthogonal with respect to the first main surface, the common wiring is formed so as to cover the second switch.

In addition, it is preferable that the above-described electro-optical device include: one electrode of the second portion; a second dielectric; another electrode of the second portion mutually facing the one electrode of the second portion through the second dielectric; one electrode of the first portion arranged so as to overlap with the other electrode of the second portion when viewed from a direction orthogonal to the first main surface and electrically connected to the other electrode of the second portion; a first dielectric; and another electrode of the first portion mutually facing the one electrode of the first portion through the first dielectric and electrically connected to the one electrode of the second portion.

In addition, in the above-described electro-optical device, it is preferable that the other electrode of the second portion and the one electrode of the first portion be formed as a common electrode.

In addition, in the above-described electro-optical device, it is preferable that the one electrode of the second portion be a part of the common wiring.

In addition, in the above-described electro-optical device, it is preferable that the second storage capacitor be provided with a third portion and a fourth portion, and that, when viewed from a direction orthogonal to the first main surface, the third portion and the fourth portion be formed so as to overlap. According to the aspect of the invention, since the second storage capacitor includes the third portion and the fourth portion connected in parallel, and these are arranged so as to overlap when viewed from a direction orthogonal to the first main surface, it is possible to obtain a large capacitance value with a small area. As a result, it is possible to increase the ratio of the area of the substrate occupied by the pixel circuit.

In addition, it is preferable that the above-described electro-optical device further include: one electrode of the fourth portion; a fourth dielectric; another electrode of the fourth portion mutually facing the one electrode of the fourth portion through the fourth dielectric; one electrode of the third portion arranged so as to overlap with the other electrode of the fourth portion when viewed from a direction orthogonal to the first main surface and electrically connected to the other electrode of the fourth portion; a third dielectric; and another electrode of the third portion mutually facing the one electrode of the third portion through the third dielectric and electrically connected to the one electrode of the fourth portion.

In addition, in the above-described electro-optical device, it is preferable that the other electrode of the fourth portion and the one electrode of the third portion be formed as a common electrode.

In addition, in the above-described electro-optical device, it is preferable that the pixel circuit include a second transistor turning on or off between the data line and the gate of the first transistor, and a third transistor turning on or off between the gate and the drain of the first transistor, and that the driving circuit including the level shift circuit electrically connect the data line and a first power supply line supplying an initial potential and electrically connect the other end of the second storage capacitor and a second power supply line supplying a predetermined potential in a first period; electrically disconnect the data line and the first power supply line and turn on the second transistor and the third transistor in a state where the connection of the other end of the second storage capacitor and the second power supply line is maintained in a second period following on from the first period; electrically disconnect the other end of the second storage capacitor and the second power supply line and supply a data signal supplied before the third period and held in the second storage capacitor to the other end of the second storage capacitor in a third period following on from the second period; and turn off the second transistor when the third period finishes.

According to the aspect of the invention, in the first period, the data line, the first storage capacitor, and the second storage capacitor are initialized. In the second period, when the second transistor and the third transistor are respectively turned on, the data line and the gate of the first transistor become a potential corresponding to the threshold voltage of the first transistor. In the third period, when a data signal supplied before the third period and held in the first storage capacitor is supplied to the other end of the second storage capacitor in a state where the second transistor is turned on and a signal of the potential according to the luminance is supplied to the other end of the first storage capacitor, the data line and the gate of the first transistor are shifted from the potential according to the threshold voltage by an amount by which the potential change in the other end of the second storage capacitor is voltage-divided by the capacitance ratio. As a result, the potential range in the gate of the first transistor can be narrowed with respect to the potential range in the other end of the second storage capacitor. For this reason, according to the invention, it is possible to accurately supply the current supplied to the light-emitting element while compensating for the characteristics of the transistor without the need for a data signal of fine precision.

In addition, it is preferable that the above-described electro-optical device further include a second switch to the input end of which the data signal is supplied before the third period and to the output end of which one end of the first storage capacitor is connected, in which the second storage capacitor is connected in series to the first storage capacitor through the first switch, the second switch is turned on before the third period in a state where the first switch is turned off, and the first switch is turned on in a state where the second switch is turned off in the third period.

In addition, in the above-described electro-optical device, it is preferable that the substrate be a semiconductor substrate.

It is preferable that the above-described electro-optical device include: a substrate; a scanning line provided on an upper side of a first main surface of the substrate; a data line provided on the upper side of the first main surface; a pixel circuit provided corresponding to an intersection of the scanning line and the data line; and a first storage capacitor holding a first voltage corresponding to a data signal, in which the first storage capacitor includes a first portion and a second portion connected in parallel, the first portion includes a first capacitor electrode and a second capacitor electrode, the second portion includes a third capacitor electrode and a fourth capacitor electrode, and the first capacitor electrode and the third capacitor electrode overlap when viewed from a direction orthogonal with respect to the first main surface.

It is preferable that the above-described electro-optical device further include a second storage capacitor having one end connected to the data line and a third storage capacitor connected to the data line, in which the second storage capacitor includes a fifth capacitor electrode and a sixth capacitor electrode, the pixel circuit includes a pixel capacitor holding a second voltage according to the data signal, the second voltage is generated based on the first voltage, the fifth capacitor electrode and one end of the first storage capacitor are electrically connected in at least the first period, the sixth capacitor electrode is connected to the data line, and the second voltage is generated by capacitance division of the first voltage with at least the second storage capacitor and the third storage capacitor.

Here, in addition to the electro-optical device, the invention can be conceived as a driving method of an electro-optical device or an electronic apparatus having the electro-optical device. Examples of the electronic apparatus typically include display apparatuses such as a head mounted display (HMD), or an electronic viewfinder.

BRIEF DESCRIPTION OF THE DRAWINGS

The invention will be described with reference to the accompanying drawings, wherein like numbers reference like elements.

FIG. 15 is a perspective view showing an HMD using the electro-optical device according to the embodiments and the like.

DESCRIPTION OF EXEMPLARY EMBODIMENTS

Figure 1:
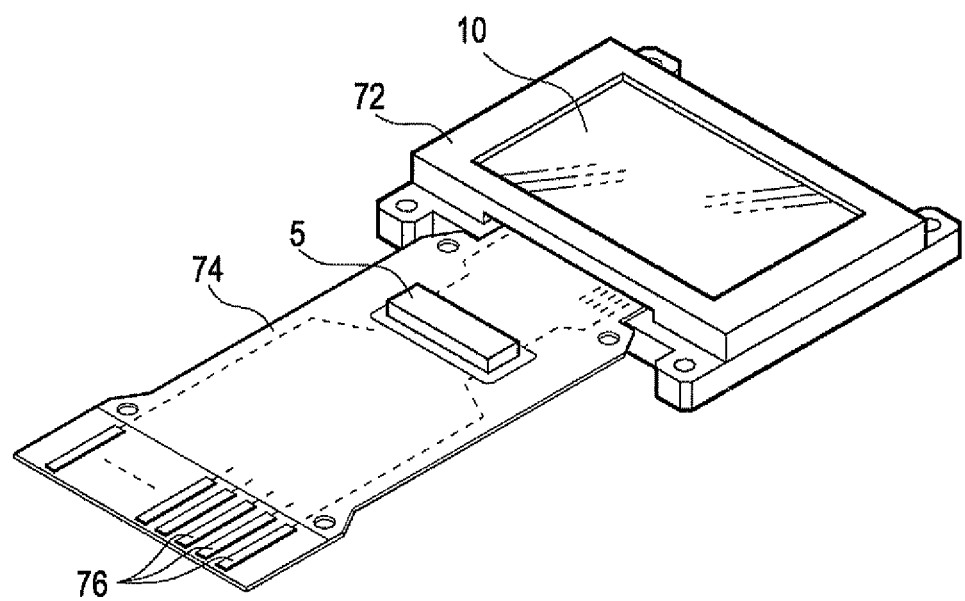
FIG. 1 is a perspective view showing a configuration of an electro-optical device according to an embodiment of the invention.

Below, aspects for embodying the invention will be described with reference to the drawings.
Electrical Configuration of Electro-Optical Device FIG. 1 is a perspective view showing a configuration of an electro-optical device 10 according to an embodiment of the invention.

For example, the electro-optical device 10 is a micro display displaying an image in a head mounted display. Detailed description will be given of the electro-optical device 10 later; however, the device is an organic EL apparatus in which a plurality of pixel circuits and driving circuits or the like driving the pixel circuits are formed on a silicon substrate, for example, in which an OLEO which is an example of a light-emitting element is used in the pixel circuits.

The electro-optical device 10 is accommodated in an opening in a display unit or a see-through frame-shaped case 72, and one end of an FPC (Flexible Printed Circuit) substrate 74 is connected thereto. In the FPC substrate 74, a control circuit 5 of a semiconductor chip is mounted using a COF (Chip On Film) technique and a plurality of terminals 76 are provided and connected to a high order circuit omitted from the drawings. Image data is synchronized with a synchronization signal and supplied from the high order circuit through the plurality of terminals 76. The synchronization signal includes a vertical synchronization signal, a horizontal synchronization signal, and a dot clock signal. In addition, the image data regulates the gradation level of the pixels of the image to be displayed using 8 bits, for example.

The control circuit 5 combines the functions of a power circuit of the electro-optical device 10 and a data signal output circuit. That is, in addition to supplying each type of control signal and various types of potential generated in accordance with the synchronization signal to the electro-optical device 10, the control circuit 5 converts the digital image data to an analog data signal and performed supply thereof to the electro-optical device 10.

Figure 2:
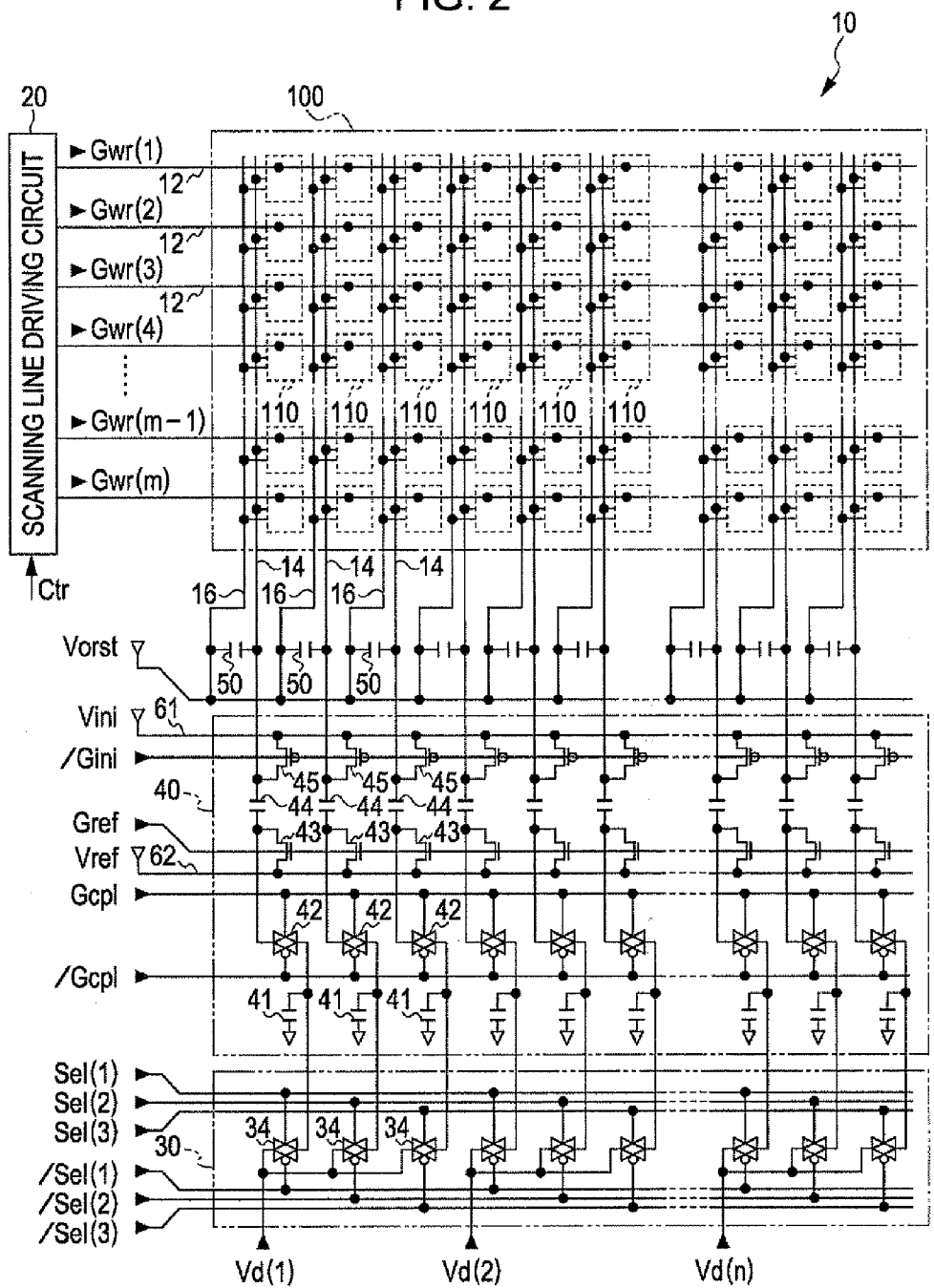
FIG. 2 is a view showing a configuration of the same electro-optical device.

FIG. 2 is a view showing a configuration of the electro-optical device 10 according to the embodiment. As shown in the drawing, the electro-optical device 10 is divided broadly into a scanning line driving circuit 20, a demultiplexer 30, a level shift circuit 40, and a display unit 100.

Among these, in the display unit 100, pixel circuits 110 corresponding to the pixels of the image to be displayed are arranged in a matrix shape. In detail, in the display unit 100, m rows of scanning lines 12 are provided to extend in the horizontal direction in the drawing, and, (3n) columns of data lines 14 grouped in threes are provided to extend in the vertical direction in the drawing and preserve the electrical insulation between each of the scanning lines 12. Then, pixel circuits 110 corresponding to the intersection portions between the m rows of scanning lines 12 and the (3n) columns of data lines 14 are provided. For this reason, in the present embodiment, the pixel circuits 110 are arranged in a matrix shape with m rows vertically×(3n) columns horizontally.

Here, m and n are both natural numbers. In the matrix of the scanning lines 12 and the pixel circuit 110, in order to distinguish the rows, there are cases where the rows are referred to as 1, 2, 3, . . . , (m−1), and m in order from the top of the drawing. In the same manner, in order to distinguish between the columns of the matrix of the data lines 14 and the pixel circuits 110, there are cases where the columns are referred to as 1, 2, 3, ..., (3n−1), and (3n) in order from the left of the drawing. In addition, when the integer j of 1 or more to n or less is used in order to generalize and explain the groups of the data lines 14, it signifies that the data lines 14 of the (3j−2) column, the (3j−1) column, and the (3j) column belong to the j-th group counted from the left.

Here, three pixel circuits 110 corresponding to the intersections of the scanning lines 12 of the same row and three columns of the data lines 14 belonging to the same group respectively correspond to pixels of R (red), G (green), and B (blue), and these three pixels express one dot of the color image to be displayed. That is, in the present embodiment, a color of one dot is configured to be expressed using additive color mixing according to the emitted light of the OLED corresponding to RGB.

In the present embodiment, in each column, power supply lines 16 (third power supply lines) are respectively provided along the data lines 14. A potential Vorst as a reset potential is supplied in common to each power supply line 16. In addition, a storage capacitor 50 is provided in each column. In detail, one end of the storage capacitor is connected to the data line 14 and the other end is connected to the power supply line 16. For this reason, the storage capacitor 50 functions as a third storage capacitor holding the potential of the data line 14.

Here, it is preferable to adopt a configuration in which the storage capacitor 50 is formed by interposing an insulating body (dielectric body) with wiring configuring the data lines 14 and wiring configuring the power supply line 16.

In addition, the storage capacitor 50 is provided on the outside of the display unit 100 in FIG. 2; however, this is only an equivalent circuit, and it may be provided in the inside of the display unit 100 or passing from the inside to the outside thereof as a matter of course. Further, although omitted in FIG. 2, the capacitance of the storage capacitor 50 is set as Cdt.

Here, the following kind of control signal is supplied by the control circuit 5 to the electro-optical device 10. In detail, a control signal Ctr for controlling the scanning line driving circuit 20, control signals Sel(1), Sel(2), and Sel(3) for controlling the selection with the demultiplexer 30, control signals /Sel(1), /Sel(2), and /Sel(3) which had a logic inversion relationship with respect to these signals, a negative logic control signal /Gini for controlling the level shift circuit 40, and a positive logic control signal Gref are supplied to the electro-optical device 10. In addition, in practice, the control signal Ctr includes a plurality of signals such as a pulse signal or a clock signal, and an enable signal.

In addition, the data signals Vd(1), Vd(2), ..., and Vd(n) matching the selection timing of the demultiplexer 30 are supplied to the electro-optical device 10 by the control circuit 5 corresponding to the groups numbered 1, 2, and n. Here, the maximum value of the potential that can be taken by the data signals Vd(1) to Vd(n) is set as Vmax and the minimum value is set as Vmin.

The scanning line driving circuit 20 generates scanning signals for scanning the scanning lines 12 in order one row at a time throughout the period of the frame in accordance with the control signal Ctr. Here, the scanning signals supplied to the scanning lines 12 of rows numbered 1, 2, 3, ..., (m−1), and m are denoted as Gwr(1), Gwr(2), Gwr(3), ..., Gwr(m−1), and Gwr(m).

Here, in addition to the scanning signals Gwr(1) to Gwr(m), the scanning line driving circuit 20 generates various types of control signals synchronized with the scanning signals for each row and performs supply thereof to the display unit 100; however, these are not drawn in FIG. 2. Further, the period of the frame refers to the period necessary for the electro-optical device 10 to display an image of one cut (frame) portion, for example, if the frequency of the orthogonal synchronization signal included in the synchronization signal is 120 Hz, the one cycle portion is a period of 8.3 milliseconds.

The demultiplexer 30 is a collection of transmission gates 34 provided for each column, and supplies data signals in order to the three columns configuring each group.

Here, the input ends of the transmission gates 34 corresponding to the columns (3j−2), (3j−1), and (3j) belonging to the j-numbered groups are mutually connected in common and respective data signals Vd(j) are supplied to the common terminals.

The transmission gates 34 provided in columns (3j−2) which are the left end columns in the j-numbered groups are turned on (conduct) when the control signal Sel(1) is the H level (control signal /Sel(1) is the L level). Similarly, the transmission gates 34 provided in columns (3j−1) which are the middle columns in the j-numbered groups are turned on when the control signal Sel(2) is the H level (when the control signal /Sel(2) is the L level) and the transmission gates 34 provided in columns (3j) which are the right end columns in the j-numbered groups are turned on when the control signal Sel(3) is the H level (when the control signal /Sel(3) is the L level).

The level shift circuit 40 has a set of the storage capacitor 44, the P channel MOS type transistor 45, and the N channel MOS type transistor 43 for each column, and shifts the potential of the data signals output from the output end of the transmission gate 34 of each column. Here, one end of the storage capacitor 44 is connected to a data line 14 of the corresponding column and the drain node of the transistor 45 while the other end of the storage capacitor 44 is connected to the output end of the transmission gate 34 and the drain node of the transistor 43. For this reason, the storage capacitor 44 functions as a second storage capacitor of which one end is connected to the data lines 14. Although omitted from FIG. 2, the capacitance of the storage capacitor 44 is set to Crf1.

The source nodes of the transistors 45 of each column are connected in common across each column to a power supply line 61 supplying the potential Vini as the initial potential, and the control signal /Gini is supplied in common across each column to the gate nodes. For this reason, the transistor 45 is configured so as to electrically connect the data lines 14 and the power supply lines 61 when the control signal /Gini is the L level and to perform electrical disconnection when the control signal /Gini is the H level.

In addition, the source nodes of the transistors 43 of each column are connected in common across each column to the power supply line 62 supplying the potential Vref as a predetermined potential, and the control signal Gref is supplied in common across each column to the gate nodes. For this reason, the transistor 43 is configured so as to electrically connect the node h which is the other end of the storage capacitor 44 and the power supply lines 62 when the control signal Gref is the H level and to perform electrical disconnection when the control signal Gref is the L level.

Further, the transmission gates 42 in each column are electrically interposed between the output ends of the transmission gates 34 and the other ends of the storage capacitors 44. That is, the input ends of the transmission gates 42 are connected to the output ends of the transmission gates 34 and the output ends of the transmission gates 42 are connected to the other ends of the storage capacitors 44. For this reason, the transmission gate 42 functions as a first switch.

Here, the transmission gates 42 of each column are turned on in unison when the control signal Gcpl supplied from the control circuit 5 is the H level (when the control signal /Gcpl is the L level).

Meanwhile, the transmission gate 34 in the demultiplexer 30 functions as a second switch.

In addition, one end of the storage capacitor 41 in each column is connected to the output end (input end of the transmission gate 42) of the transmission gate 34, and the other end of the storage capacitor 41, for example, is grounded in common to fixed potential, for example, a potential Vss. Although omitted in FIG. 2, the capacitance of the storage capacitor 41 is set to Crf2. Here, the potential Vss is equivalent to the L level of the scanning signals or control signals, which are logic signals. Further, the storage capacitor 41 functions as a first storage capacitor in which a data signal is temporarily held and the held data signal is supplied to the other end of the storage capacitor 44 at a predetermined timing. Here, one storage capacitor 41 is connected with respect to one data line 14 and provided at the outside of the display unit 100.

In the present embodiment, although divided into the scanning line driving circuit 20, the demultiplexer 30 and the level shift circuit 40 for convenience, these may be conceived together as driving circuits driving the pixel circuits 110.

Description will be given of the pixel circuits 110 with reference to FIG. 3. Since each pixel circuit 110 has the same configuration as the others electrically, here, description will be given taking the pixel circuit 110 of the i row (3j–2) column positioned at the (3j–2)-th column of the left end side in the groups numbered j, which is an i-th row, as an example.

In addition, i is a reference sign of a case generally showing rows in which the pixel circuits 110 are arranged, and is an integer of 1 or more and m or less.

Figure 3:
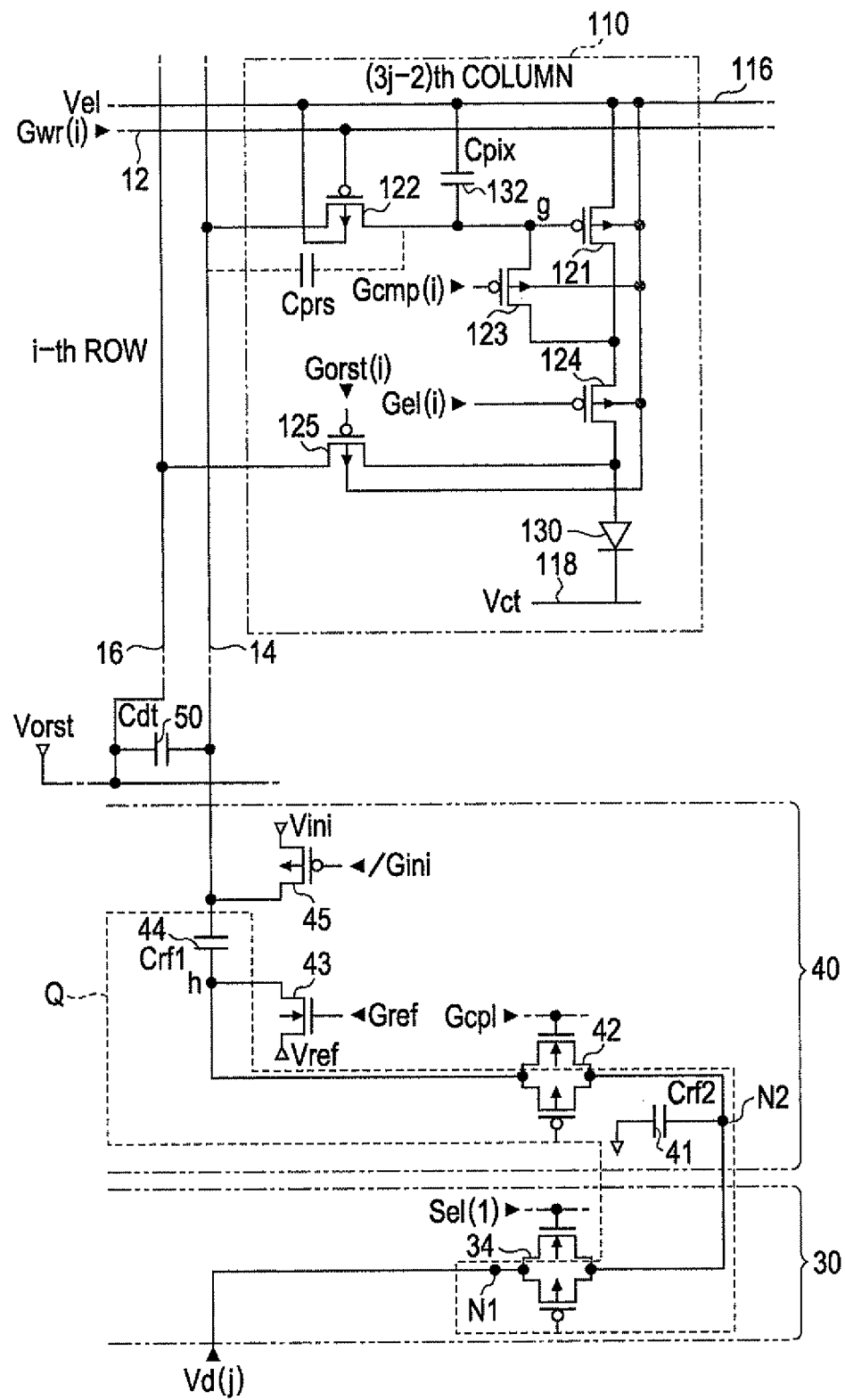
FIG. 3 is a view showing a pixel circuit in the same electro-optical device.

As shown in FIG. 3, the pixel circuit 110 includes P channel MOS type transistors 121 to 125, an OLED 130, and a storage capacitor 132. The scanning signal Gwr(i), the control signals Gel(i), Gcmp(i), and Gorst(i) are supplied to the pixel circuits 110. Here, the scanning signal Gwr(i), and the control signals Gel(i), Gcmp(i), and Gorst(i) are supplied by the scanning line driving circuit 20 corresponding to the respective i rows. For this reason, the scanning signal Gwr(i), and the control signals Gel(i), Gcmp(i), and Gorst(i) are also supplied in common to pixel circuits of columns other than the (3j–2) column being focused on if in the i row.

In the transistor 122 in the pixel circuit 110 of the i row (3j–2) column, the gate node is connected to the scanning line 12 of the i-th row, one of the drain or source node is connected to the data line 14 of the (3j–2) column, and the other is respectively connected to the gate node g in the transistor 121, one end of the storage capacitor 132, and the drain node of the transistor 123. Here, the gate node of the transistor 121 is denoted as g so as to be distinguished from other nodes.

In the transistor 121, the source node is connected to the power supply line 116, and the drain node is respectively connected to the source node of the transistor 123 and the source node of the transistor 124. Here, the potential Vel which is the high order side of the power in the pixel circuit 110 is supplied to the power supply line 116.

The control signal Gcmp(i) is supplied to the gate node in the transistor 123.

The control signal Gel(i) is supplied to the gate node in the transistor 124 and the drain node is respectively connected to the source node of the transistor 125 and the anode of the OLED 130.

The control signal Gorst(i) corresponding to the row is supplied to the gate node in the transistor 125, and the drain node is connected to the power supply line 16 of (3j–2) column and preserved at the potential Vorst.

Here, the transistor 121 is equivalent to the first transistor, the transistor 122 is equivalent to the second transistor, and the transistor 123 is equivalent to the third transistor. Further, the transistor 125 is equivalent to the fourth transistor, and the transistor 124 is equivalent to the fifth transistor.

The other end of the storage capacitor 132 is connected to the power supply line 116. For this reason, the storage capacitor 132 holds the voltage between the source and the gate of the transistor 121. Here, when the capacitance of the storage capacitor 132 is denoted as Cpix, the capacitance Cdt of the storage capacitor 50, the capacitance Crf1 of the storage capacitor 44, and the capacitance Cpix of the storage capacitor 132 are set so that Cdt>Crf1>>Cpix That is, Cdt is set to be greater than Crf1, and Cpix is set to be sufficiently smaller than Cdt and Crf1.

Here, as the storage capacitor 132, a parasitic capacitance on the gate node g of the transistor 121 may be used, or a capacitance formed by interposing an insulating layer with conductive layers which are different to each other above the silicon substrate may be used.

Since the electro-optical device 10 in the present embodiment is formed on a silicon substrate, the substrate potential of the transistors 121 to 125 is set to the potential Vel.

The anode of the OLED 130 is a pixel electrode provided individually for each pixel circuit 110. In contrast, the cathode of the OLED 130 is a common electrode 118 common across all of the pixel circuits 110, and preserved at the potential Vct which is the low order side of the power in the pixel circuits 110.

In the above-described silicon substrate, the OLED 130 is an element in which a white organic EL layer is interposed by an anode and a cathode having light permeability. Here, on the output side (cathode side) of the OLED 130, a color filter corresponding to any one of RGB is superimposed.

In such an OLED 130, when the current flows from the anode to the cathode, the holes injected from the anode and the electrons injected from the cathode are recombined in the organic EL layer, excitors are produced, and white light is generated. The white light generated at this time passes through a cathode of the opposite side to the silicon substrate (anode), is colored by the color filter, and configured to be visible on the observation side.

Operation of Electro-Optical Apparatus

Figure 4:
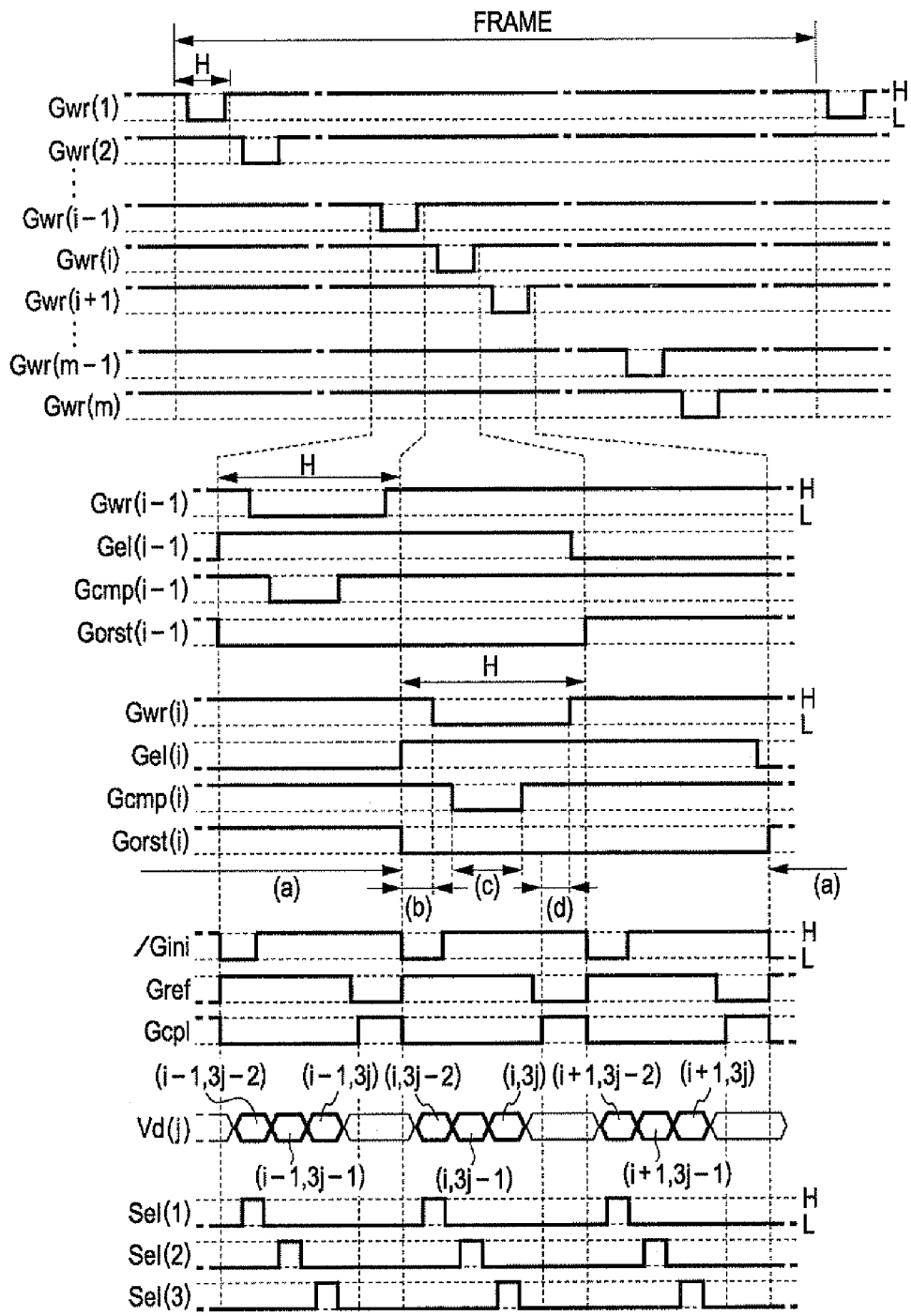
FIG. 4 is a timing chart showing an operation of the same electro-optical device.

Description will be given of the operation of the electro-optical device 10 with reference to FIG. 4. FIG. 4 is a timing chart for illustrating operations of each portion in the electro-optical device 10.

As shown in the drawing, the scanning signals Gwr(1) to Gwr(m) are sequentially switched to the L level and, in the period of one frame, 1 to m rows of scanning lines 12 are scanned in order for each single horizontal scanning period (H).

The operation in the single horizontal scanning period (H) is common across the pixel circuits 110 of each row. In the following, description will be given of the operation in a scanning period in which an i-th row is horizontally scanned with particular focus on the pixel circuit 110 of the i row (3j–2) column.

In the present embodiment, when classifying the scanning periods of the i-th row, in FIG. 4, the periods are divided into an initialization period shown by (b), a compensation period shown by (c), and a writing period shown by (d). Here, after the writing period of (d), after a pause, a light-emitting period shown by (a) is started, and the scanning period of the i-th row is reached again after the passing of the period of one frame. For this reason, regarding the chronological order, a cycle of (light-emitting period)→initialization period→compensation period→writing period→(light-emitting period) is repeated.

Here, in FIG. 4, each of the scanning signal Gwr(i−1), the control signals Gel(i−1), Gcmp(i−1) and Gorst(i−1) corresponding to the (i−1)-th row one row before the i row forms a waveform which is earlier than each of the scanning signal Gwr(i), and the control signals Gel(i), Gcmp(i) and Gorst(i) corresponding to the i row by a single horizontal scanning period (H) only.

Here, the writing period of (d) is a period from the time the control signal Gcpl changes from the L to the H level (when the control signal /Gcpl has become the L level) until the time the scanning signal changes from the L to the H level. However, in the present embodiment, the writing period is not equal to the supply period of the data signal and the supplying of the data signal precedes the writing period. In detail, the data signals can be supplied over the initialization period of (a) and the compensation period of (b).

Light-Emitting Period

For convenience of explanation, description will be given from the light-emitting period which is a prerequisite for the initialization period. As shown in FIG. 4, in the light-emitting period of the i-th row, the scanning signal Gwr(i) is the H level and the control signal Gel(i) is the L level. In addition, among the control signals Gel(i), Gcmp(i), and Gorst(i) which are logic signals, the control signal Gel(i) is the L level, and the control signals Gcmp(i) and Gorst(i) are the H level.

Figure 5:
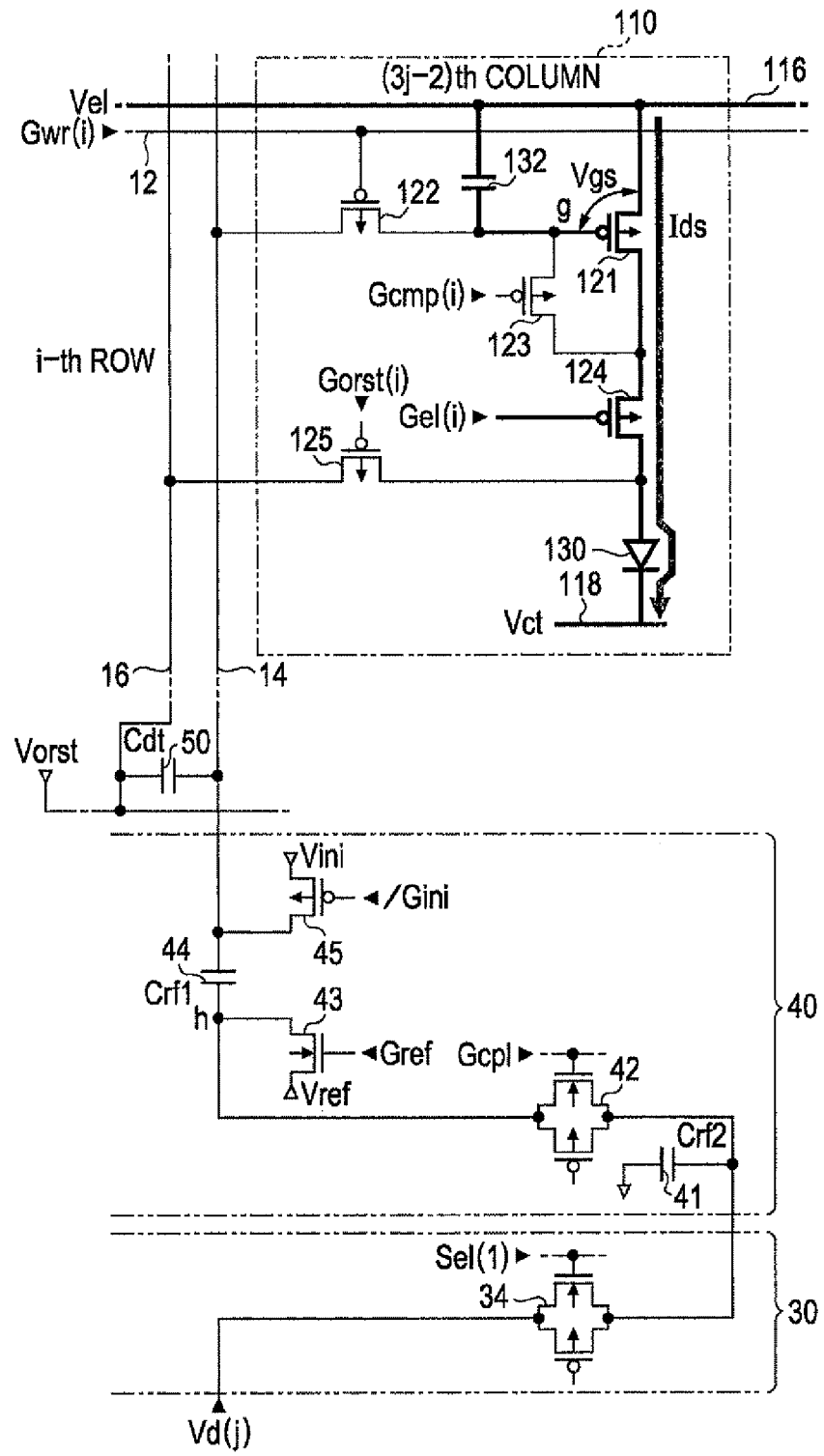
FIG. 5 is an explanatory diagram of operations of the same electro-optical device.

For this reason, in the pixel circuits 110 of the i row (3j−2) column as shown in FIG. 5, the transistor 124 is turned on while the transistors 122, 123, and 125 are turned off. Therefore, the transistor 121 supplies a current Ids according to the voltage Vgs between the gate and the source to the OLED 130. As will be described later, the Vgs voltage in the light-emitting period in the present embodiment is a value level-shifted according to the potential of the data signals from the threshold voltage of the transistor 121. For this reason, in the OLED 130, the current according to the gradation level is supplied in a state where the threshold voltage of the transistor 121 is compensated.

In addition, since the light-emitting period of the i-th row is a period in which horizontal scanning of other than the i row is performed, the potential of the data lines 14 is appropriately changed. However, in the pixel circuit 110 of the i-th row, since the transistor 122 is turned off, here, potential changes of the data lines 14 are not considered.

Figure 6:
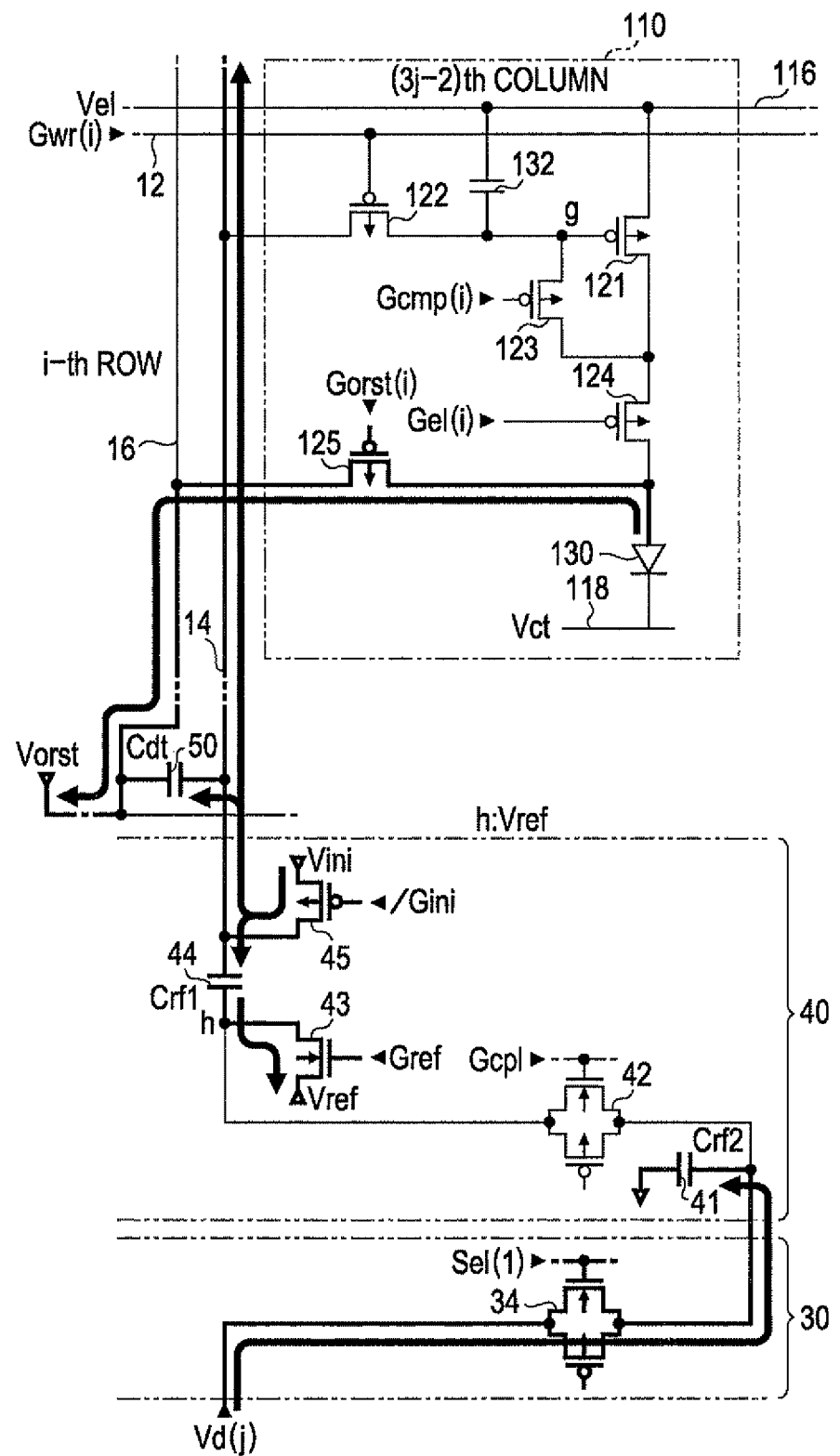
FIG. 6 is an explanatory diagram of operations of the same electro-optical device.
Figure 7:
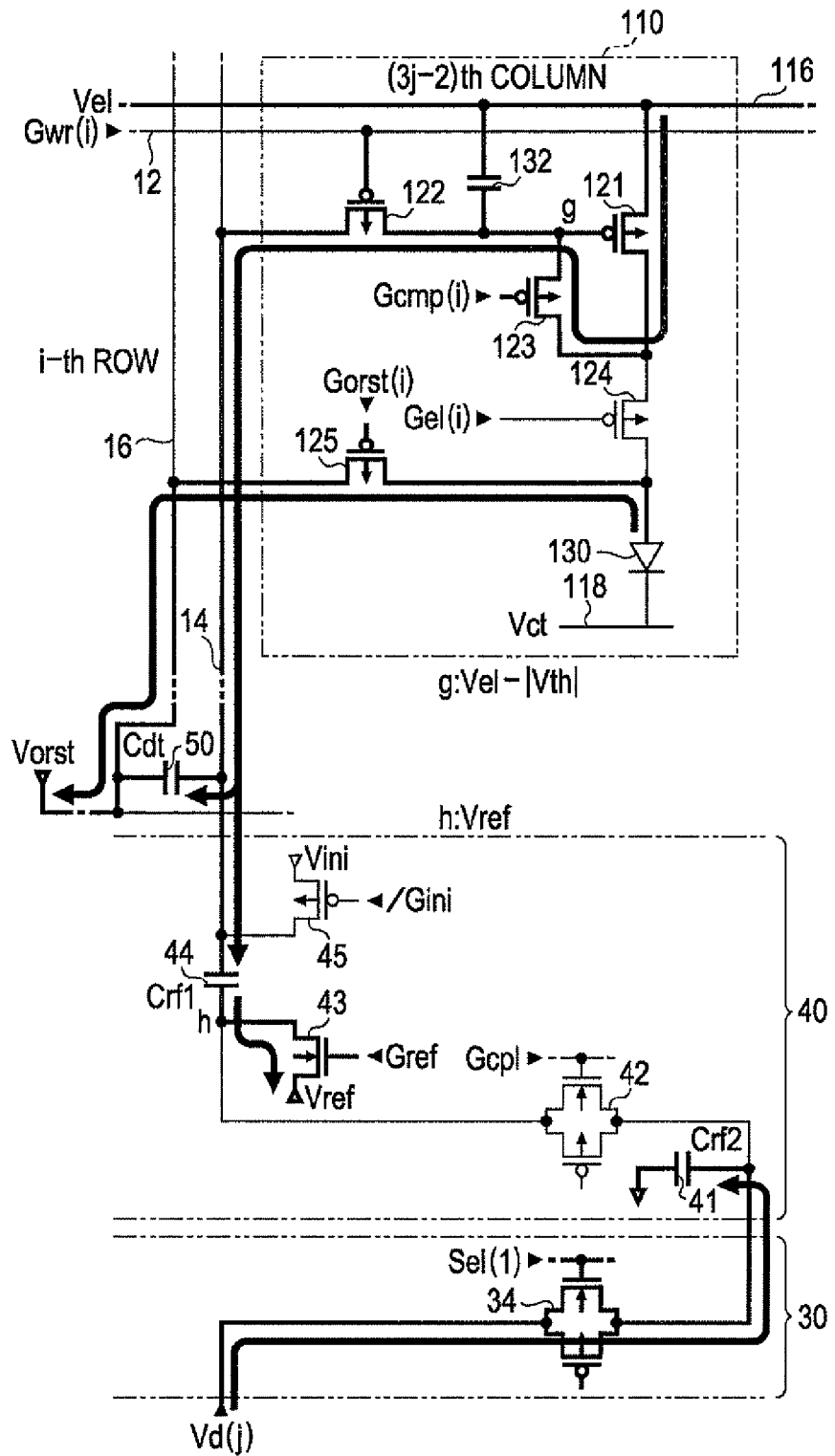
FIG. 7 is an explanatory diagram of operations of the same electro-optical device.
Figure 8:
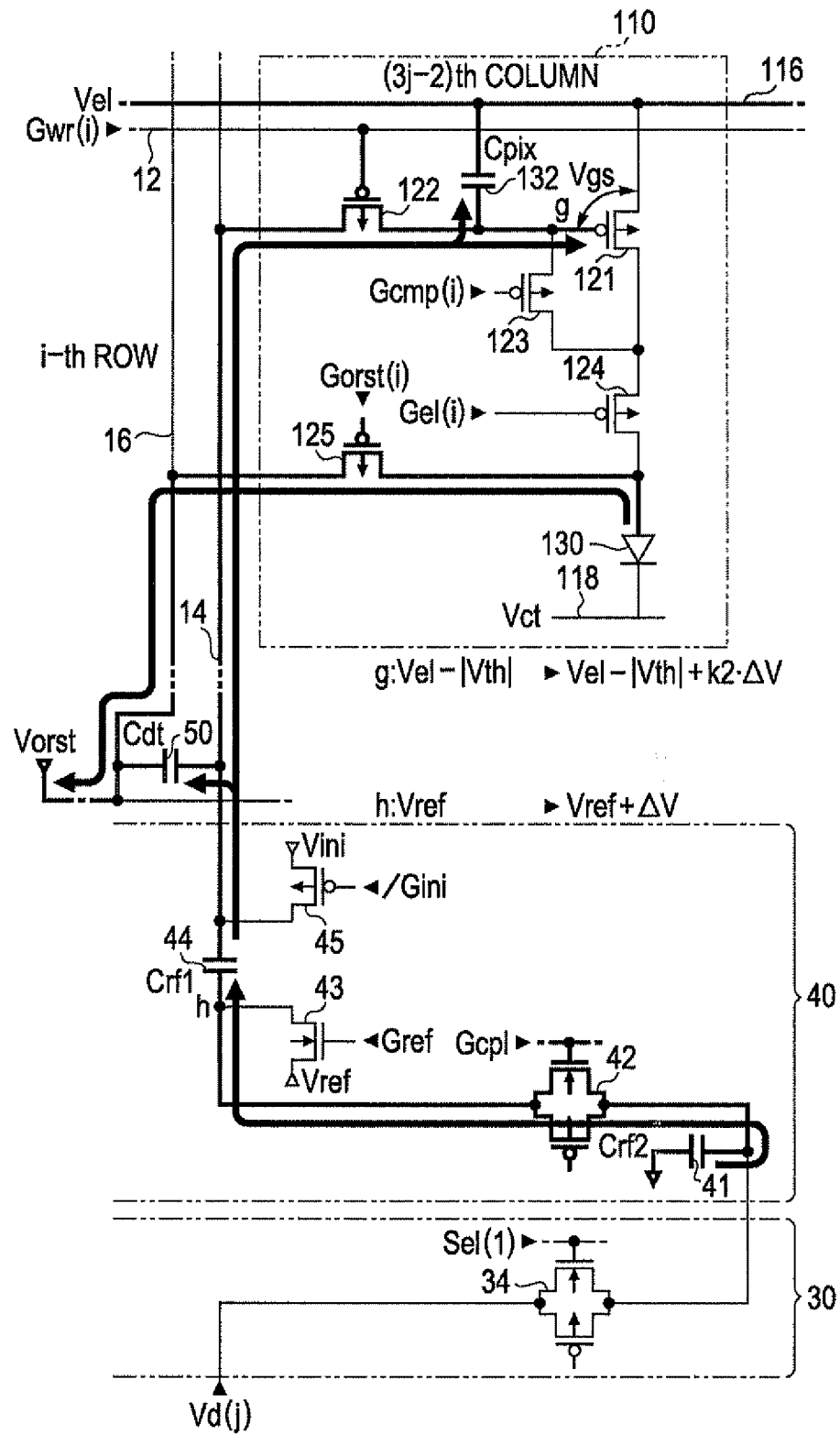
FIG. 8 is an explanatory diagram of operations of the same electro-optical device.

In addition, in FIG. 5, the path which is important in the description of the operation is shown with a bold line (the same applies in FIGS. 6 to 8).

Initialization Period

Next, when the scanning period of the i row is reached, first, the initialization period of (b) is started as the first period. In the initialization period, in comparison with the light-emitting period, the control signal Gel(i) is changed to the H level and the control signal Gorst(i) is changed to the L level, respectively.

For this reason, as shown in FIG. 6, in the pixel circuit 110 of the i row (3j−2) column, the transistor 124 is turned off and the transistor 125 is turned on. In this manner, the path of the current supplied to the OLED 130 is interrupted and the anodes of the OLED 130 are reset to the potential Vorst.

Since the OLED 130 has a configuration in which the organic EL layer is interposed by the anode and the cathode as described above, as shown by a broken line in the drawing, a capacitor Coled has a parasitic effect in parallel between the anode and the cathode. When the current was flowing in OLED 130 in the light-emitting period, the voltages of both ends between the anode and the cathode of the OLED 130 are held by the capacitor Coled; however, the held voltage is reset by turning on the transistor 125. For this reason, in the present embodiment, when the current flows again to the OLED 130 in the subsequent light-emitting period, it is not easily affected by the influence of the voltage held by the capacitor Coled.

In detail, for example, when a high luminance display state is changed to a low luminance display state, if the configuration is one which is not reset, since a high voltage of the time when the luminance was high (a large current was flowing) is held, next, an excessive current is made to flow when trying to make a small current flow and it becomes impossible to obtain the low luminance display state. In contrast, in the present embodiment, since the potential of the anode of the OLED 130 is reset by turning the transistor 125 on, the reproducibility of the low luminance side can be improved.

In this embodiment, regarding the potential Vorst, the difference between the potential Vorst and the potential Vct of the common electrode 118 is set so as to fall below the light-emitting threshold voltage of the OLED 130. For this reason, in the initialization period (the compensation period and writing period described next), the OLED 130 is in an off (non-light-emitting) state.

On the other hand, in the initialization period, since the control signal /Gini is the L level and the Control signal Gref is the H level, the transistors 45 and 43 as shown in FIG. 6 are respectively turned on in the level shift circuit 40. For this reason, the data line 14 which is one end of the storage capacitor 44 is initialized to the potential Vini and the node h which is the other end of the storage capacitor 44 is initialized to the potential Vref, respectively.

Regarding the potential Vini in the present embodiment, (Vel-Vini) is set to be larger than the threshold voltage |Vth| of the transistor 121. In addition, since the transistor 121 is a P channel type, the threshold voltage Vth based on the potential of the source node is negative. Here, in order to prevent confusion in the description of the relationship between high and low, the threshold voltage is set to be expressed by the absolute value |Vth| and regulated by magnitude correlation.

In addition, with respect to the potential which can be taken by the data signals Vd(1) to Vd(n), the potential Vref in the present embodiment is set to a value such that the potential of the node h in the subsequent writing period is increased, for example, set to be lower than the minimum value Vmin.

The control circuit 5 supplies the data signals over the initialization period and the compensation period. In other words, the control circuit 5 sequentially switches the data signal Vd(j) to the potential according to the gradation level of the pixels of the i row (3j−2) column, the i row (3j−1) column, and the i row (3j) column in the j-numbered group and, while doing so, sets the control signals Sel(1), Sel(2), and Sel(3) in order exclusively to the H level in combination with the switching of the potential of the data signal. In this manner, in the demultiplexer 30, the transmission gates 34 are turned on in order of the left end column, the center column, and the right end column respectively in each group.

Figure 14:
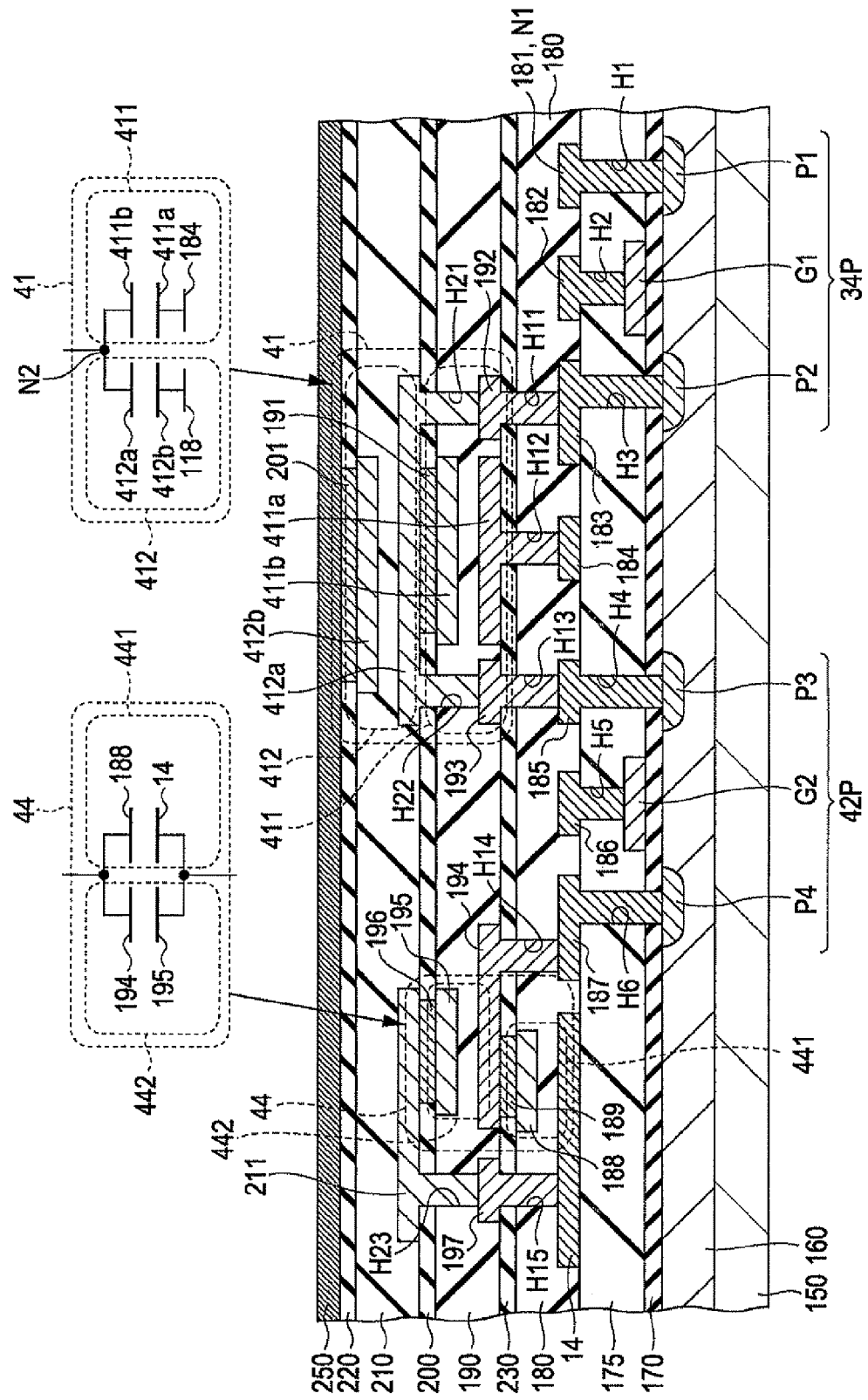
FIG. 14 is a cross-sectional view showing a structure of a fourth embodiment of the same electro-optical device.

Here, in the initialization period, when the transmission gate 34 of the left end column belonging to the j-numbered group is turned on by the control signal Sel(1), as shown in FIG. 14, since the data signal Vd(j) is supplied to one end of the storage capacitor 41, the data signal is held by the storage capacitor 41.

Compensation Period

In the scanning period of the i-th row, next, the compensation period of (c) is the second period. In the compensation period, in comparison with the initialization period, the scanning signal Gwr(i) and the control signal Gcmp(i) are the L level. Meanwhile, in the compensation period, the control signal /Gini is the H level in a state where the control signal Gref is maintained at the H level.

For this reason, as shown in FIG. 7, in the level shift circuit 40, the node h is fixed at the potential Vref by turning off the transistor 45 in a state where the transistor 43 is turned on. Meanwhile, since the gate node g is electrically connected to the data lines 14 by turning on the transistor 122 in the pixel circuit 110 of the i row (3j–2) column, the gate node g becomes the potential Vini at the start of the compensation period.

Since the transistor 123 is turned on in the compensation period, the transistor 121 becomes a diode connection. For this reason, the drain current flows in the transistor 121 and charges the gate node g and the data lines 14. In detail, the current flows in a path of the power supply line 116→the transistor 121→transistor 123→the transistor 122→the data line 14 of the (3j–2)-th column. For this reason, the data lines 14 and the gate node g which are in a mutually connected state due to the turning on of the transistor 121 are increased from the potential Vini.

However, since the current flowing in the above path flows less easily as the gate node g approaches the potential (Vel–|Vth|), the data line 14 and the gate node g are saturated by the potential (Vel–|Vth|) until the end of the compensation period is reached. Accordingly, the storage capacitor 132 holds the threshold voltage |Vth| of the transistor 121 until the end of the compensation period is reached.

In the compensation period, since the control signal /Gini becomes the H level in a state where the control signal Gref is maintained at the H level, the node h in the level shift circuit 40 is fixed at the potential Vref.

Further, in the compensation period, when the transmission gate 34 of the left end column belonging to the j-numbered group is turned on by the control signal Sel(1), the data signal Vd(j) is held by the storage capacitor 41.

Here, when the transmission gate 34 of the left end column belonging to the j-numbered group is already turned on by the control signal Sel1) in the initialization period, the transmission gate 34 is not turned on in the compensation period; however, there is no change in the point that the data signal Vd(j) is held by the storage capacitor 41.

Further, since the control signal Gcmp(i) is the H level when the compensation period is finished, the diode connection of the transistor 121 is canceled.

Since the control signal Gref becomes the L level in the time from the finishing of the compensation period to the start of the next writing period, the transistor 43 is turned off. For this reason, the path leading up to the gate node g in the pixel circuit 110 of i row (3j–2) column from the data line 14 of the (3j–2) column is in a floating state; however, the potential in the path is maintained at (Vel–|Vth|) by the storage capacitors 50 and 132.

Writing Period

After the initialization period, the writing period of (d) as the third period is reached. In the writing period, since the control signal Gcmp(i) becomes the H level, the diode connection of the transistor 121 is canceled, while since the control signal Gref becomes the L level, the transistor 43 is turned off. For this reason, the path from the data line 14 of the (3j–2) column to the gate node g in the pixel circuit 110 of the i row (3j–2) column is in a floating state, but the potential in the path is maintained at (Vel–|Vth|) by the storage capacitors 50 and 132.

For a j-numbered group, the control circuit 5 in the writing period of the i row switches the data signals Vd(j) in order to a potential according to the gradation level of pixels of the i row (3j–2) column, the i row (3j–1) column, and the i row (3j) column. Meanwhile, the control circuit 5 sets the control signals Sel(1), Sel(2), and Sel(3) in order exclusively to the H level in accordance with the switching of the potential of the data signal. The control circuit 5 has been omitted in FIG. 4; however, output is also performed for the control signals /Sel(1), /Sel(2), and /Sel(3) which have an inverse logic relationship with the control signals Sel(1), Sel(2), and Sel(3). In this manner, in the demultiplexer 30, the transmission gates 34 in each group are turned on in order of the left end column, the center column, and the right end column, respectively.

Here, when the transmission gate 34 of the left end column is turned on by the control signals Sel(1), and /Sel(1), as shown in FIG. 8, the node h which is the other end of the storage capacitor 44 is changed from the potential Vref fixed in the initialization period and the compensation period to the potential of the data signal Vd(j), that is, to a potential according to the gradation level of pixels of the i row (3j–2) column.

Further, in the writing period, the control signal Gcpl becomes the L level (the control signal /Gcpl becomes the L level). For this reason, since the transmission gate 42 is turned on in the level shift circuit 40, the data signal held in the storage capacitor 41 is supplied to the node h which is the other end of the storage capacitor 44. For this reason, the node h shifts from the potential Vref in the compensation period. The potential change amount of the node h at this time is represented as $\Delta V$, and the potential after the change as (Vref+$\Delta V$).

Meanwhile, since the gate node g is connected to one end of the storage capacitor 44 through the data lines 14, it has a value (Vel–|Vth|+k1·$\Delta V$) shifted upwards from the potential (Vel–|Vth|) in the compensation period by a value in which the potential change amount $\Delta V$ of the node h is multiplied by the capacitance ratio k1 only. At this time, if the voltage Vgs of the transistor 121 is expressed by an absolute value, it becomes a value (|Vth|–k1·$\Delta V$) in which the shifting amount of the increased potential of the gate node g only is subtracted from the threshold voltage |Vth|.

Here, the capacitance ratio k1 is Crf1/(Cdt+Crf1). Strictly speaking, the capacitance Cpix of the storage capacitor 132 must also be considered; however, since the capacitance Cpix is set so as to become sufficiently small in comparison with the capacitance Crf1 and Cdt, it has been ignored.

Figure 9:
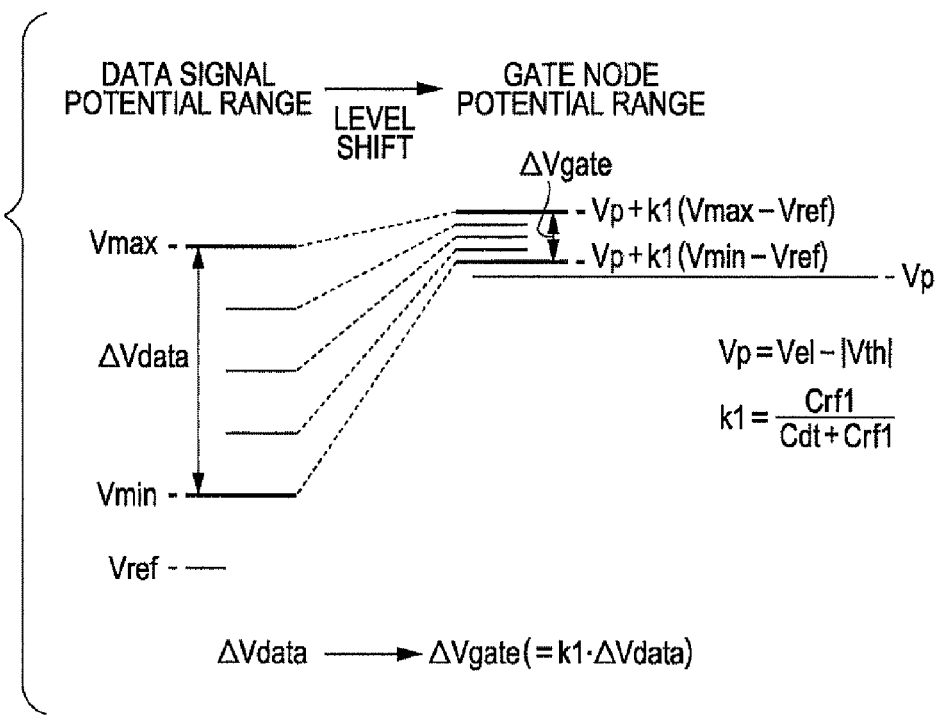
FIG. 9 is a diagram showing amplitude compression of a data signal in the same electro-optical device.

FIG. 9 is a view showing the relationship between the potential of the data signal and the potential of the gate node g in the writing period. The data signal supplied from the control circuit 5 can take a potential range of from the minimum value Vmin to the maximum value Vmax according to the gradation level of the pixels as described above. In the present embodiment, the data signals are not written directly to the gate node g, but are level-shifted as shown in the drawing and written to the gate node g.

At this time, the potential range $\Delta V$ gate of the gate node g is compressed to a value in which the potential range $\Delta V$ data (=Vmax–Vmin) of the data signal is multiplied by the capacitance ratio k1. For example, when the capacitance of the storage capacitors 44 and 50 are set so that Crf1:Cdt=1:9, it is possible to compress the potential range $\Delta V$ gate of the gate node g to $\frac{1}{10}$ of the potential range $\Delta V$ data of the data signal.

In addition, regarding in which direction and to what extent the potential range $\Delta V$ gate of the gate node g is shifted with respect to the potential range ΔV data of the data signal, determination can be made with the potential Vp (Vel−|Vth|), and Vref. This is because the potential range ΔV data of the data signal is compressed by the capacitance ratio k1 based on the potential Vref and one in which the compression range is shifted based on the potential Vp becomes the potential range ΔV gate of the gate node g.

In the writing period of such an i-th row, a potential (Vel−|Vth|+k1·ΔV) shifted from a potential (Vel−|Vth|) in the compensation period by an amount in which the potential change amount ΔV of the node h is multiplied by the capacitance ratio k1 is written to the gate node g of the pixel circuit 110 of the i-th row.

Eventually, the scanning signal Gwr(i) becomes the H level and the transistor 122 is turned off. In this manner, the writing period is finished and the potential of the gate node g is confirmed at the shifted value.

Emitting Period

After the writing period of the i-th row is finished, the light-emitting period is reached during the single horizontal scanning period. In this light-emitting period, since the control signal Gel(i) as described above becomes the L level, the transistors 124 in the pixel circuits 110 of the i row (3j−2) columns are turned on. Since the voltage Vgs between the gate and the source is (|Vth|−k1·ΔV), as shown in the previous FIG. 5, the current according to the gradation level is supplied to the OLED 130 in a state where the threshold voltage of the transistor 121 is compensated.

Such an operation is performed in parallel in terms of time in the scanning period of the i row and the also in the other pixel circuits 110 of the i-th row other than the pixel circuits 110 of the (3j−2)-th column. In addition, such an operation of the i-th row is in practice performed in the order of 1, 2, 3, . . . , (m−1), and m-th row in the period of one frame, and is repeated for each frame.

According to the present embodiment, since the potential range ΔV gate in the gate node g is narrowed with respect to the potential range ΔV data of the data signal, even if the data signal is not cut up with fine precision, it is possible to apply a voltage reflecting the gradation level between the gate and source of the transistor 121. For this reason, even in a case where a small current flowing through the OLED 130 with respect to changes of the voltage Vgs between the gate and the source of the transistor 121 in the fine pixel circuit 110 is changed to a relatively large extent, it is possible to control the current supplied to the OLED 130 with high precision.

In addition, as shown by a broken line in FIG. 3, there is a parasitic capacitance between the data lines 14 and the gate node g in the pixel circuit 110 in practice. For this reason, if the potential change range of the data line 14 is large, there is propagation to the gate node g through the parasitic capacitance Cprs, whereby so-called cross-talk, non-uniformity, or the like is generated and the display quality is decreased. The influence of the parasitic capacitance Cprs is remarkably apparent when the pixel circuit 110 is miniaturized.

In contrast, in the present embodiment, since the potential change range of the data lines 14 is also narrowed with respect to the potential range ΔV data of the data signal, it is possible to suppress the influence through the parasitic capacitance Cprs.

According to the present embodiment, since it is possible to preserve a period which is longer than the scanning period, for example, 2 horizontal scanning periods, as the period in which the transistor 125 is turned on, that is, the reset period of the OLED 130, it is possible to sufficiently initialize the voltage held in the parasitic capacitance of the OLED 130 in the light-emitting period.

In addition, according to the present embodiment, in the current Ids supplied to the OLED 130 by the transistor 121, the influence of the threshold voltage is canceled out. For this reason, according to the present embodiment, even if the threshold voltage of the transistor 121 varies for each pixel circuit 110, since the variations are compensated and the current according to the gradation level is supplied to the OLED 130, the generation of display non-uniformity adversely affecting the uniformity of the display screen is suppressed and, as a result, a high-quality display is possible.

Figure 10:
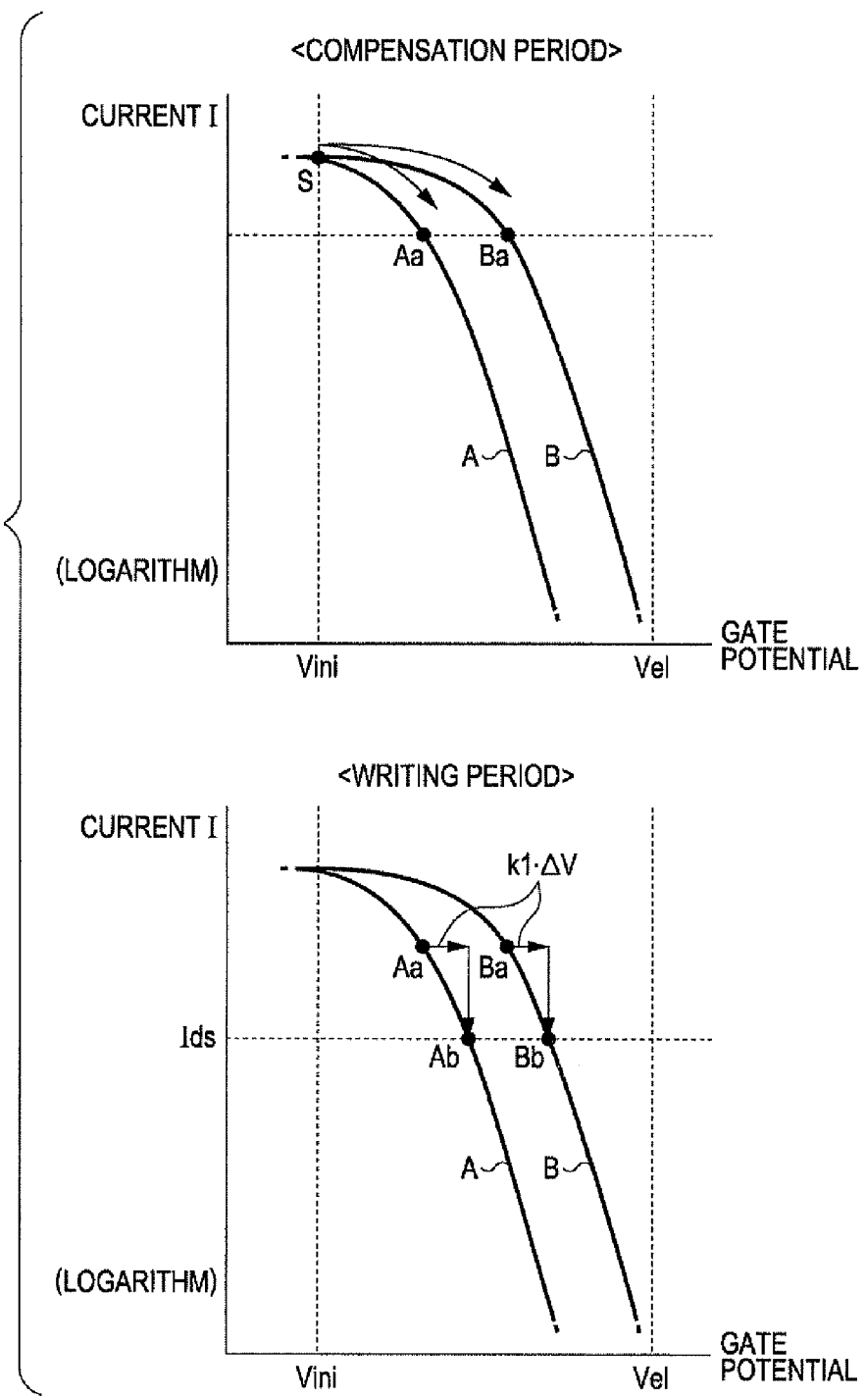
FIG. 10 is a diagram showing characteristics of a transistor in the same electro-optical device.

Description will be given of this canceling out with reference to FIG. 10. As shown in this drawing, in order to control the small current supplied to the OLED 130, the transistor 121 operates in a weak inversion region (sub-threshold region).

In the drawing, A illustrates a transistor for which the threshold voltage |Vth| is large and B illustrates a transistor for which the threshold voltage |Vth| is small, respectively. Here, in FIG. 10, the voltage Vgs between the gate and the source is the difference between the characteristic shown by the solid line and the potential Vel. Further, in FIG. 10, the current of the vertical scale is shown by a logarithm in which the direction from the source toward the drain is set as positive (up).

The gate node g in the compensation period becomes a potential (Vel−|Vth|) from the potential Vini. For this reason, for the transistor A in which the threshold voltage |Vth| is large, the operation point moves from S to Aa while, for the transistor B in which the threshold voltage |Vth| is small, the operation point moves from S to Ba.

Next, In a case where the potentials of the data signals to the pixel circuits 110 to which the two transistors belong are the same, that is, in a case where the same gradation level is indicated, in the writing period, the potential shift amounts from the operation points Aa and Ba are both the same k1·ΔV. For this reason, for transistor A, the operation point moves from Aa to Ab, and for transistor B, the operation point moves from Ba to Bb; however, the currents at the operation points after the potential shift are aligned at almost the same Ids for both the transistors A and B.

Further, the operation of holding the data signal supplied through the demultiplexer 30 from the control circuit 5 in the storage capacitor 41 is performed from the initialization period to the compensation period. For this reason, it is possible to relax the time constraints on the operation to be performed in one horizontal scanning period.

For example, since the current flowing in the transistor 121 decreases as the voltage Vgs between the gate and the source in the compensation period approaches the threshold voltage, time is needed for the gate nodes g to converge at the potential (Vel−|Vth|); however, it is possible to ensure a long compensation period. It is possible to compensate for the variation of the threshold voltage of transistor 121 with fine precision. In addition, it is possible to slow down the supply operation of the data signals.

Structure of Electro-Optical Device

Next, four aspects of the structure of the electro-optical device 10 will be exemplified.

First Aspect

Figure 11:
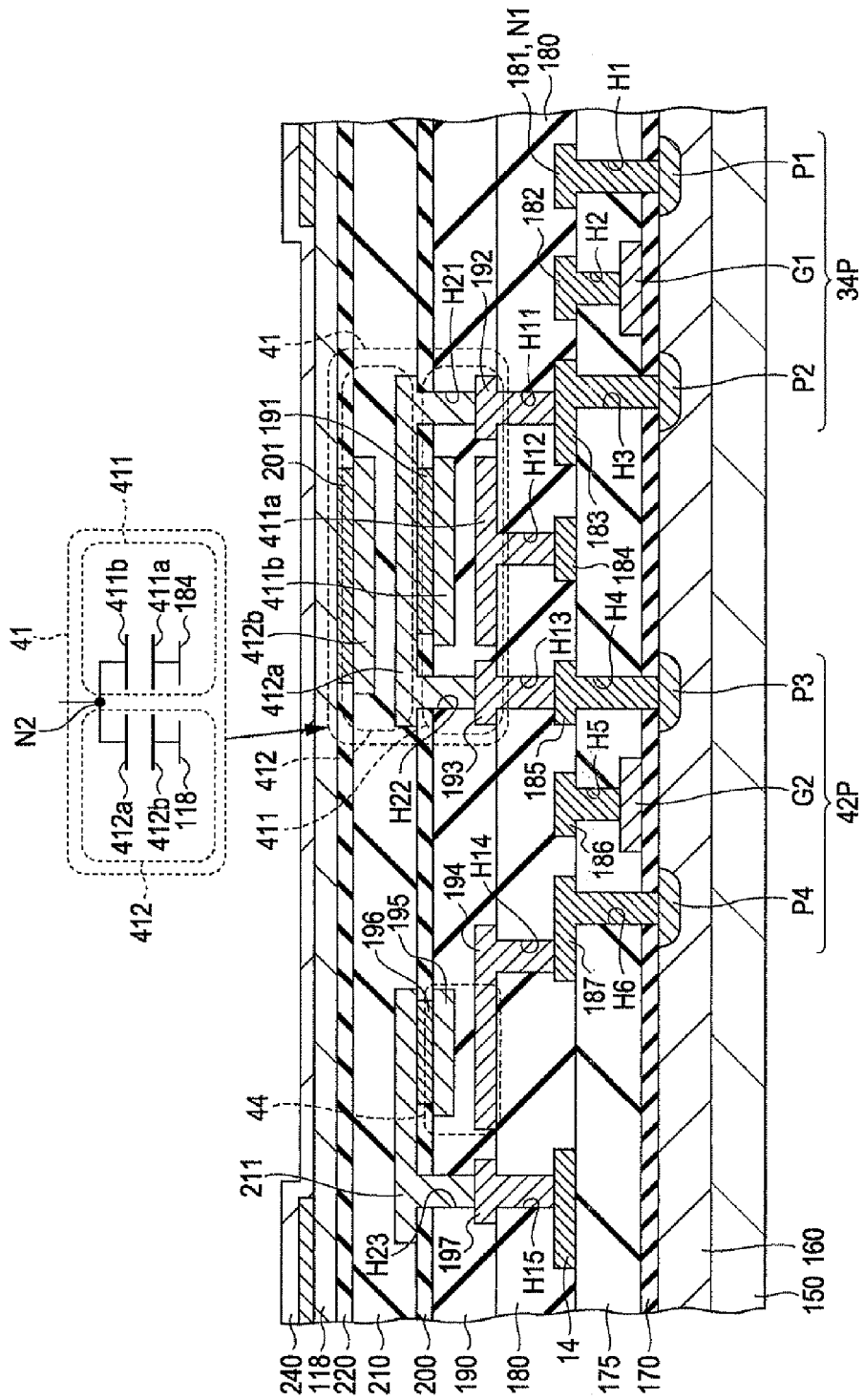
FIG. 11 is a cross-sectional view showing a structure of a first embodiment of the same electro-optical device.

FIG. 11 shows an example of a section structure of the configuration Q of the demultiplexer 30 and the level shift circuit 40 shown in FIG. 3, which is surrounded by a dotted line. N wells 160 are formed on the semiconductor substrate 150 shown in the drawing. The semiconductor substrate 150 and the N wells 160 are common to the electro-optical device 10 and the scanning line driving circuit 20 and the display unit 100 are also formed thereon. Diffusion layers P1, P2, P3 and P4 doped with ions are formed in the N wells 160. Further, gate electrodes G1 and G2 are formed through the gate insulating film 170. The gate electrodes G1 and G2 are configured by polysilicon. The transistor 34P configures the transmission gate 34 shown in FIG. 3 and the transistor 42P configures the transmission gate 42.

One of the diffusion layers P1 and P2 is a drain electrode of the transistor 34P and the other is a source electrode. A first insulating layer 175 is formed on the gate electrodes G1 and G2. The diffusion layer P1 is connected to the wiring 181 through the contact hole H1. The wiring 181 is equivalent to the node N1 shown in FIG. 3, and a data signal Vd(j) is supplied thereto. Further, the gate electrode G1 is connected to gate wiring 182 through the contact hole H2. The diffusion layer P2 is connected to the wiring 183 through the contact hole H3.

Further, one of the diffusion layers P3 and P4 is a drain electrode of the transistor 42P and the other is a source electrode. The diffusion layer P3 is connected to the wiring 185 through the contact hole H4. Further, the gate electrode G2 is connected to the gate wiring 186 through the contact hole H5. The diffusion layer P4 is connected to the wiring 183 through the contact hole H6. Here, the wirings 181 to 188 are configured by conductive metal such as aluminum.

Next, description will be given of the storage capacitor 41 (first storage capacitor) provided between the transistors 34P and 42P. The storage capacitor 41 is provided with a first capacitance portion 411 and a second capacitance portion 412. The first capacitance portion 411 is provided with an electrode 411a (other electrode), an electrode 411b (one electrode), and a third insulating layer 190 (first dielectric). Meanwhile, the second capacitance portion 412 is provided with an electrode 412a (other electrode), an electrode 412b (one electrode), and a fifth insulating layer 210 (second dielectric).

The electrode 411a of the first capacitance portion 411 is connected to the wiring 184 through the contact hole H12 formed in the second insulating layer 180. The wiring 184 is electrically connected to the common electrode 118 (common wiring) to which the potential Vct is supplied. Meanwhile, the electrode 411b of the first capacitance portion 411 is connected to the electrode 412a of the second capacitance portion through the connection wiring 191. The fourth insulating layer 200 can be configured using SiN, SiO$_2$ or the like. The provision of the connection wiring 191 is to shorten the distance between the electrode 411a and the electrode 411b and increase the capacitance value of the first capacitance portion 411. Here, the cathode 240 of the OLED 130 is formed on the common electrode 118.

The electrode 412b of the second capacitance portion 412 is connected with the common electrode 118 through the connection wiring 201. The sixth insulating layer 220 can be configured using a SiN, SiO$_2$, or the like. The electrode 412b of the second capacitance portion 412 is connected with the wiring 192 through the contact hole H21, and the wiring 192 is connected to the transistor 34P through the contact hole H11. Further, the electrode 412a is connected to the wiring 193 through the contact hole H22, and the wiring 193 is connected to the transistor 42P through the contact hole H13.

That is, the storage capacitor 41 is configured to connect the first capacitance portion 411 and the second capacitance portion 412 in parallel, and the electrode 412a and the electrode 411b are equivalent to the node N2 shown in FIG. 3. In this manner, since the first capacitance portion 411 and the second capacitance portion 412 are arranged so as to overlap when viewed from a direction orthogonal with respect to the semiconductor substrate 150, it is possible to reduce the area of the storage capacitor 41.

Next, description will be given of the storage capacitor 44. The storage capacitor 44 includes an electrode 194, an electrode 195, and a third insulating layer 190. The electrode 194 is connected to the transistor 42P through the contact hole H14. The electrode 194 is equivalent to the node h shown in FIG. 3. The electrode 195 is connected to the wiring 211 through the connection wiring 196. The wiring 211 is connected to the wiring 197 through the contact hole H23, and the wiring 197 is connected to the data line 14 through the contact holes.

The storage capacitor 41 holds a data signal supplied through the transmission gate 34 in the compensation period as described with reference to FIG. 7, and has a function of supplying the data signal to the node h of the storage capacitor 44 through the transmission gate 42 in the writing period shown in FIG. 8. Accordingly, if charge leakage is generated in the holding period, an accurate data signal can no longer be supplied to the node h. For this reason, it is preferable that the capacitance value Crf2 of the storage capacitor 41 be large. Meanwhile, in order to miniaturize the electro-optical device 10, it is necessary to make the area taken up by the storage capacitor 41 small. According to the above-described first aspect, the storage capacitor 41 is configured by a first capacitance portion 411 and a second capacitance portion 412, and, since the first capacitance portion 411 and the second capacitance portion 412 are arranged so as to overlap when viewed from a direction orthogonal to the semiconductor substrate 150, it is possible to obtain a large capacitance value while continuing to compress the area of the storage capacitor 41. Further, since it is necessary for the storage capacitor 41 to be provided at each column of the plurality of pixel circuits 110 arranged in the display unit 100 and it is possible to compress the area thereof, the inter-column distance can be shortened and it is possible to display a high-definition image. Further, since the area of the driving circuit can be compressed, the area of the display unit 100 other than that taken up by the electro-optical device 10 is compressed and it is possible to realize so-called frame narrowing.

In addition, in the driving circuit, there is a possibility of an erroneous operation if outside light is incident thereon. Meanwhile, in the display unit 100, since luminance unevenness is generated when the potential of the common electrode 118 varies according to the place, it is preferable that the impedance of the common electrode 118 be low. Thus, in the present embodiment, the common electrode 118 covers the display unit 100 and, furthermore, is formed so as to cover the driving circuits such as the level shift circuit 40 and the demultiplexer 30. In this manner, along with causing the impedance of the common electrode 118 to decrease, it is possible to prevent an erroneous operation by blocking light from outside to the driving circuit. Moreover, since the common electrode 118 and the electrode 412b of the second capacitance portion 412 are connected and the storage capacitor 41 is formed under the common electrode 118, it is not necessary to form a separate layer for forming the storage capacitor 41 or a separate layer for blocking light to the transistor formed under the first capacitance portion 411 and the second capacitance portion 412. As a result the configuration of the electro-optical device 10 is simplified and it is possible to reduce costs.

Second Aspect

Figure 12:
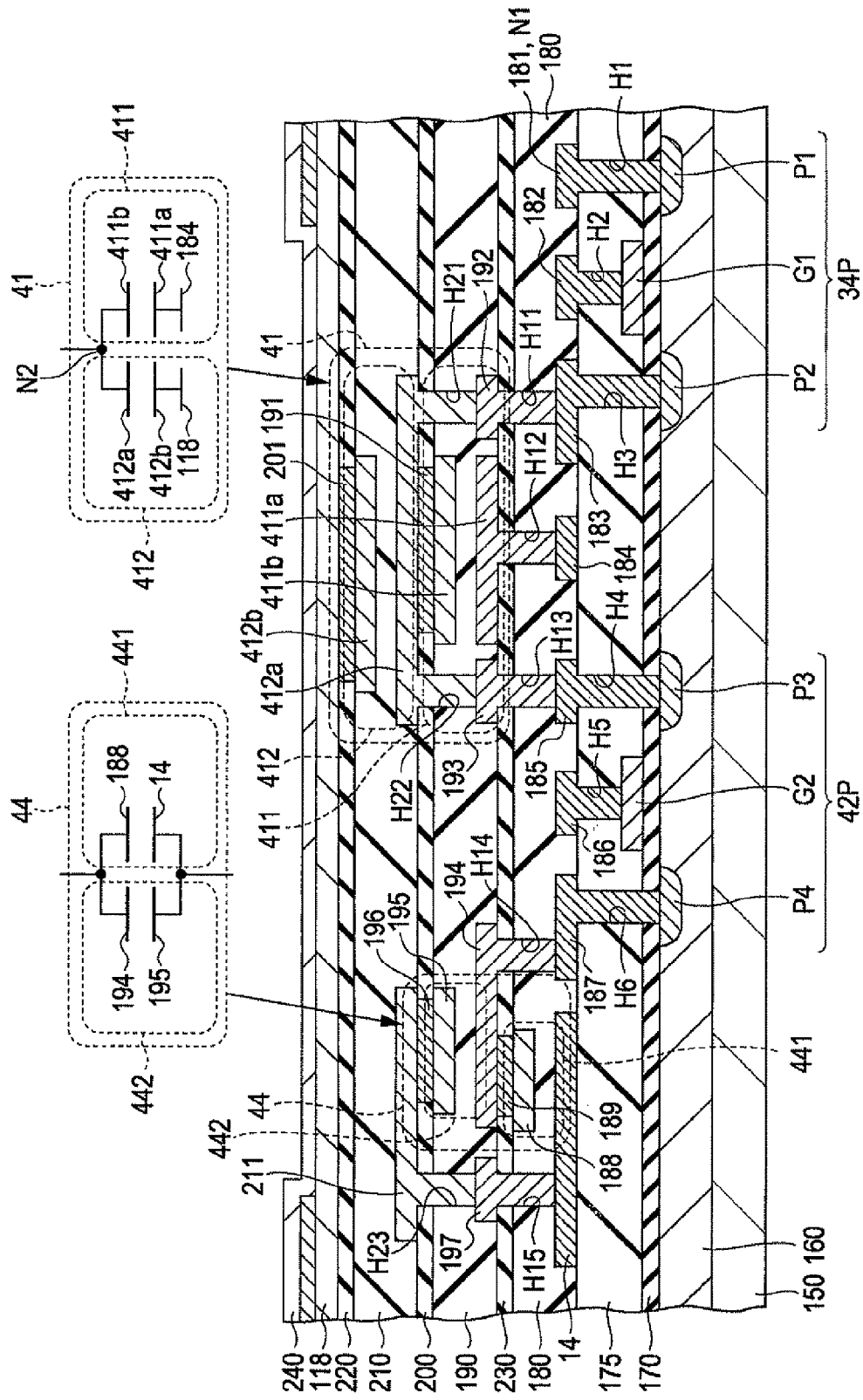
FIG. 12 is a cross-sectional view showing a structure of a second embodiment of the same electro-optical device.

FIG. 12 shows an example of a section structure of the configuration A of the demultiplexer 30 and the level shift circuit 40 shown in FIG. 3, which is surrounded by a dotted line. The second aspect is the same as the first aspect described with reference to FIG. 11 apart from the point that the storage capacitor 44 is configured with a third capacitance portion 441 and a fourth capacitance portion 442. Here, the fourth capacitance portion 442 shown in FIG. 12 is configured by an electrode 194 (other electrode), an electrode 195 (one electrode), and a third insulating layer 190 (fourth dielectric), and has the same structure as the storage capacitor 44 shown in FIG. 11. In the second aspect, the above is set as the fourth capacitance portion 442 and a third capacitance portion 441 is provided on the lower layer thereof.

The third capacitance portion 441 is formed by a data line 14 (other electrode), wiring 188 (one electrode), and a second insulating layer 180 (third dielectric). The wiring 188 is connected to wiring 194 which functions as an electrode of the fourth capacitance portion 442 through connection wiring 189. The seventh insulating layer 230 can be configured using SiN, SiO$_2$, or the like. The provision of the connection wiring 189 is to shorten the distance between the wiring 188 and the data lines 14 and increase the capacitance value of the third capacitance portion 441.

In this manner, the data lines 14 which function as an electrode of the third capacitance portion 441 are connected to the wiring 195 which functions as an electrode of the fourth capacitance portion 442 through the contact hole H15→wiring 197→contact hole H23→wiring 211→connection wiring 196. Further, the wiring 188 which function as an electrode of the third capacitance portion 441 is connected to the wiring 194 which functions as an electrode of the fourth capacitance portion 442 through the connection wiring 189. Accordingly, a storage capacitor 44 in which the third capacitance portion 441 and the fourth capacitance portion 442 are connected in parallel is formed.

The capacitance value Crf1 of the storage capacitor 44 as described above is related to the coefficient k1 determining the compression ratio of the data signal, and it is preferable that the capacitance value Crf1 be large in order to increase the compression ratio. Meanwhile, in order to miniaturize the electro-optical device 10, it is necessary to make the area taken up by the storage capacitor 44 small. According to the above-described second aspect, the storage capacitor 44 is configured by a third capacitance portion 441 and a fourth capacitance portion 442, and, since the third capacitance portion 441 and the fourth capacitance portion 442 are arranged so as to overlap when viewed from a direction orthogonal to the semiconductor substrate 150, it is possible to obtain a large capacitance value while continuing to compress the area of the storage capacitor 44. Further, since it is necessary for the storage capacitor 44 to be provided at each column of the plurality of pixel circuits 110 arranged in the display unit 100 and it is possible to compress the area thereof, the inter-column distance can be shortened and it is possible to display a high-definition image. Further, since the area of the driving circuit can be compressed, the area of the display unit 100 other than that taken up by the electro-optical device 10 is compressed and it is possible to realize so-called frame narrowing.

Third Aspect

Figure 13:
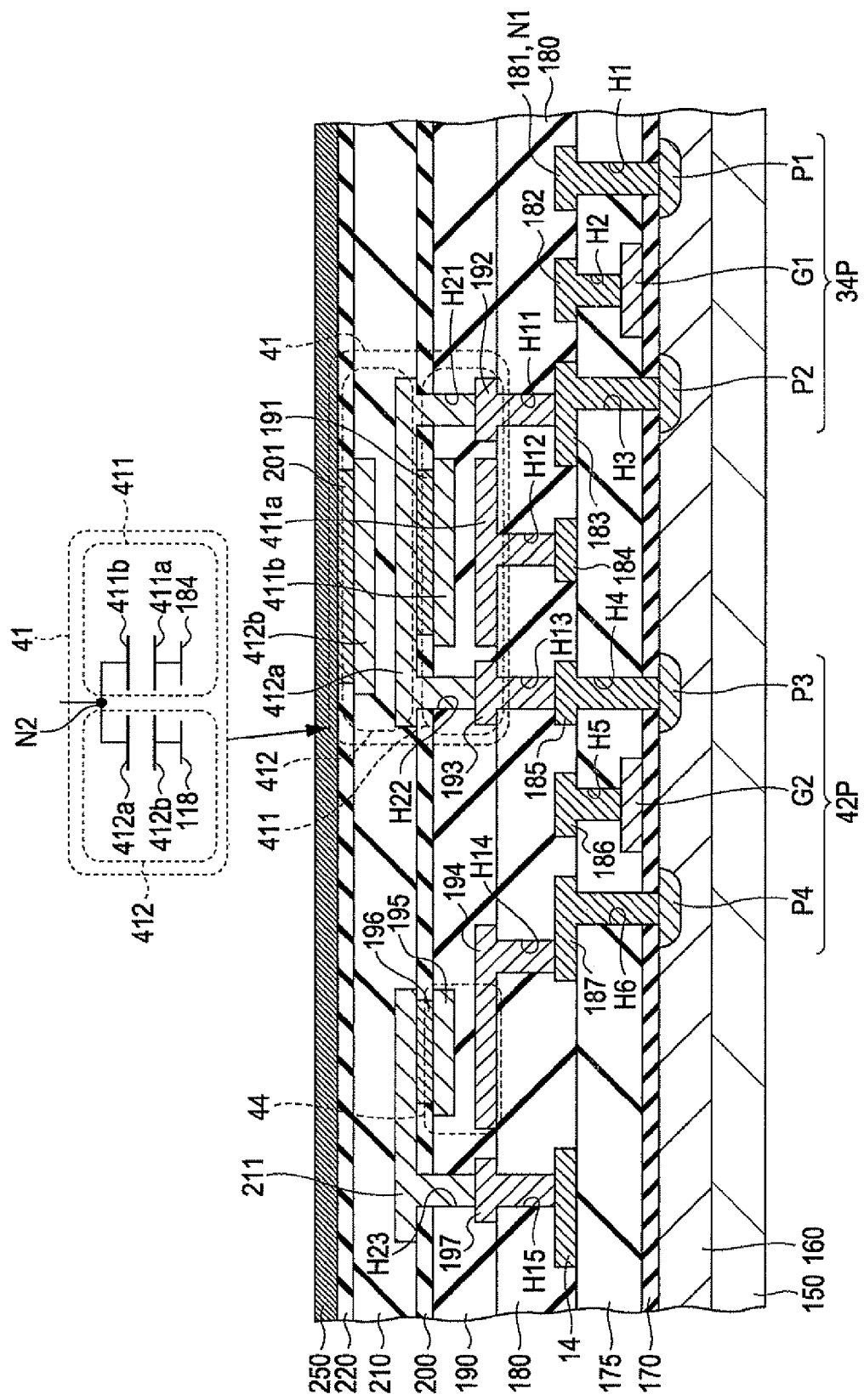
FIG. 13 is a cross-sectional view showing a structure of a third embodiment of the same electro-optical device.

In the above-described first aspect, the common electrode 118 was formed so as to cover the driving circuits such as the level shift circuit 40 and the demultiplexer 30; however, instead of the common electrode 118 as shown in FIG. 13, sheet wiring 250 (common wiring) to which the potential Vel is supplied may be used. The wiring 250 may be formed of a material having both a light blocking property and conductivity, for example, the material may be metal such as aluminum. The wiring 250 is electrically connected to the power supply line 116 to which the potential Vel is supplied in the display unit 100. Since it is possible to integrally form the wiring 250 with the power supply line 116, there is an advantage in that there are no gaps and it is possible to improve the light blocking property. In addition, there is an advantage in that it is possible to reduce the impedance of the power supply line 116 and supply stabilized power to the pixel circuits 110.

Fourth Aspect

In the above-described second aspect, the common electrode 118 was formed so as to cover the driving circuits such as the level shift circuit 40 and the demultiplexer 30; however, instead of the common electrode 118 as shown in FIG. 14, sheet wiring 250 (common wiring) to which the potential Vel is supplied may be used. The wiring 250 may be formed of a material having both a light blocking property and conductivity, for example, the material may be metal such as aluminum. The wiring 250 is electrically connected to the power supply line 116 to which the potential Vel is supplied in the display unit 100. Since it is possible to integrally form the wiring 250 with the power supply line 116, there is an advantage in that there are no gaps and it is possible to improve the light blocking property. In addition, there is an advantage in that it is possible to reduce the impedance of the power supply line 116 and supply stabilized power to the pixel circuits 110.

Application and Modification Examples

The invention is not limited to embodiments such as the above-described embodiments and application examples, and, for example, various modifications are possible as described in the following. Further, one or a plurality of arbitrarily selected forms of the modifications described below can also be combined as appropriate.

Structure of Electro-Optical Device

In the above-described first to fourth aspects, the connection wirings 189, 191, 196, and 201 were used; however, a part or all of these may be omitted and direct connection may be made to the member which is the target of the connection. In such a case, the common electrode 118 or the wiring 250 and the electrode 412b are set in common and the electrode 412b may be omitted. Further, the electrode 412b and the electrode 411b are set in common and the electrode 411b may be omitted. Further, the wiring 211 and the wiring 195 are made to be in common and the wiring 195 may be omitted. Furthermore, the wiring 194 and the wiring 188 are made to be in common and the wiring 188 may be omitted.

Further, in the above-described second aspect and fourth aspect, the first capacitance portion 411 of the storage capacitor 41 and the fourth capacitance portion 442 of the storage capacitor 44 are formed in the same layer. That is, the electrode 411a and the wiring 194, the electrode 411b and the wiring 195, the third insulating layer 190 functioning as the first dielectric and the third insulating layer 190 functioning as the fourth dielectric are respectively formed in the same layer. The invention is not limited thereto, and the first capacitance portion 411 and the third capacitance portion 441 may be formed in the same layer and the second capacitance portion 412 and the fourth capacitance portion 442 may be formed in the same layer. In a case where a storage capacitor is formed by a capacitor connected is parallel in the orthogonal direction to the semiconductor substrate 150 in this manner, it is possible to reduce the number of layers by setting separate capacitor layers configuring a certain storage capacitor and another storage capacitor to be the same.

Control Circuit

In the embodiment described above, the control circuit 5 supplying data signals is set as separate to the electro-optical device 10; however, the control circuit 5 may also be integrated in the silicon substrate with the scanning line driving circuit 20, the demultiplexer 30 and the level shift circuit 40.

Substrate

In the embodiments, a configuration was adopted in which the electro-optical apparatus 10 was integrated with a silicon substrate; however, a configuration of being integrated with another semiconductor substrate may be adopted. Further, the forming may be made in a glass substrate or the like by the application of a polysilicon process. In any case, a configuration in which the pixel circuit 110 is miniaturized and the drain current is exponentially increased with respect to changes in gate voltage Vgs in the transistor 121 is effective.

Control Signal Gcmp(i)

In the embodiments and the like, in the i-th row, the control signal Gcmp(i) was set to the H level in the writing period; however, it may be set to the L level. In other words, a configuration may be adopted in which the threshold compensation and the writing to the node gate g are performed in parallel by turning on the transistor 123.

Demultiplexer

In the embodiments and the like, a configuration is adopted in which the data lines 14 are grouped in threes, the data lines 14 are selected in order in each group, and data signals are supplied; however, the number of data lines configuring a group may be 2 or may be 4 or more.

In addition, a configuration may be adopted in which the data signals are supplied in line order together to the data lines 14 of each column without grouping, that is, without using the demultiplexer 30.

Channel Type of Transistor

In the above-described embodiments and the like, the transistors 121 to 125 in the pixel circuits 110 are standardized as P channel types; however, they may be standardized as N channel types. Further, the P channel types and N channel types may be appropriately combined.

Other

In such embodiments, an OLED which is a light-emitting element has been exemplified as an electro-optical element; however, for example, it may be one emitting light at a luminance according to the current such as an inorganic light-emitting diode or an LED (Light Emitting Diode).

Electronic Apparatus

Next, description will be given of an electronic apparatus applying the electro-optical device 10 according to such embodiments or application examples. The electro-optical device 10 is for high-definition display applications with small pixels. Thus, description will be given taking a head mounted display as an example of the electronic apparatus.

Figure 15:
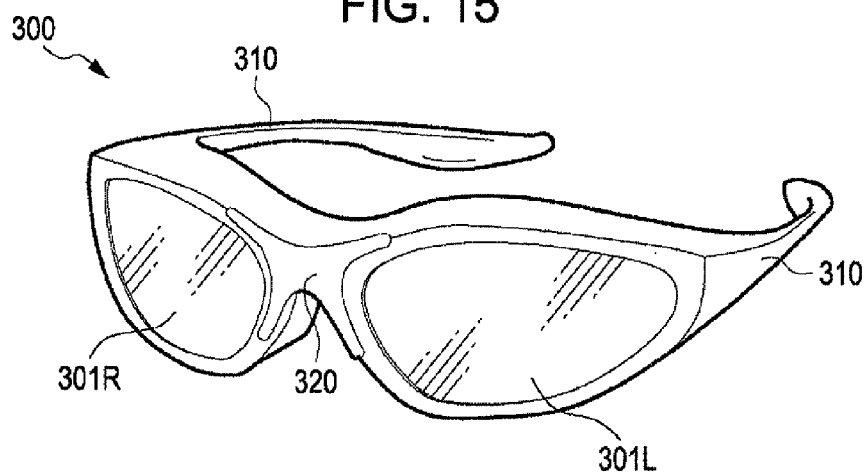
Figure 16:
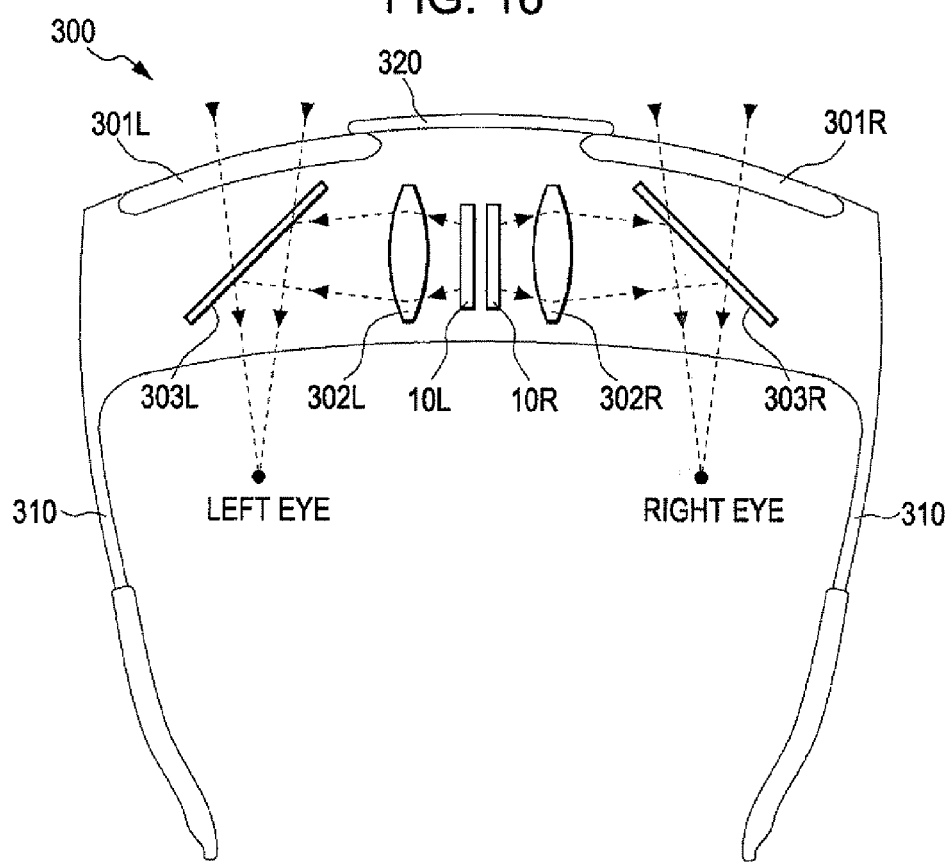
FIG. 16 is a view showing the optical configuration of the HMD.

FIG. 15 is a diagram showing the external appearance of a head mounted display and FIG. 16 is a diagram showing the optical configuration thereof.

First, as shown in FIG. 15, the head mounted display 300 includes temples 310, a bridge 320, and lenses 301L and 301R, which are similar to normal glasses in terms of the external appearance. In addition, as shown in FIG. 18, in the head mounted display 300, at the far side (bottom side in the drawing) of the lenses 301L and 301R which are in the vicinity of the bridge 320, an electro-optical device 10L for left eye use and an electro-optical device 10R for right eye use are provided.

The image display surface of the electro-optical device 10L is arranged to be on the left side in FIG. 18. In this manner, the display image according to the electro-optical device 10L is emitted in the direction of 9 o'clock in the drawing through the optical lens 302L. A half mirror 303L reflects the display image according to the electro-optical device 10L in the 6 o'clock direction while allowing light incident from the 12 o'clock direction to pass therethrough.

The image display surface of the electro-optical device 10R is arranged so as to be on the right side opposite to the electro-optical device 10L. In this manner, the display image according to the electro-optical device 10R is emitted in the direction of 3 o'clock in the drawing through the optical lens 302R. A half mirror 303R reflects the display image according to the electro-optical device 10R in the 6 o'clock direction while allowing light incident from the 12 o'clock direction to pass therethrough.

In this configuration, the wearer of the head mounted display 300 can observe the display image according to the electro-optical devices 10L and 10R in a see-through state superimposed with the outside view.

Further, in the head mounted display 300, with parallax images for both eyes, when an image for the left eye is displayed on the electro-optical device 10L and an image for the right eye is displayed on the electro-optical device 10R, the wearer can be made to perceive the displayed image as though it had a sense of depth or a stereoscopic effect (3D display).

Here, in addition to the head mounted display 300, the electro-optical device 10 can also be applied to an electronic viewfinder of a video camera, a digital camera with interchangeable lenses, or the like.

The entire disclosure of Japanese Patent Application No. 2011-246420, filed Nov. 10, 2011 is expressly incorporated by reference.

What is claimed is:

1. An electro-optical device comprising:
a substrate;
a scanning line provided on an upper side of a first main surface of the substrate;
a data line provided on the upper side of the first main surface;
a pixel circuit provided corresponding to an intersection of the scanning line and the data line; and
a first storage capacitor holding a first voltage corresponding to a data signal,
the pixel circuit including a pixel capacitor holding a second voltage according to the data signal,
the second voltage being generated based on the first voltage,
the first storage capacitor including a first portion and a second portion connected in parallel, and
the first portion and the second portion overlapping when viewed from a direction orthogonal with respect to the first main surface.

2. The electro-optical device according to claim 1, wherein when a difference between a lowest voltage value and a highest voltage value of the first voltage is a first voltage difference and a difference between a lowest voltage value and a highest voltage value of the second voltage is a second voltage difference, the second voltage difference is smaller than the first voltage difference.

3. The electro-optical device according to claim 1, further comprising a second storage capacitor having one end connected to the data line,
wherein the second voltage is generated by level shifting using the second storage capacitor.

4. The electro-optical device according to claim 3,
wherein the second storage capacitor includes a first capacitor electrode and a second capacitor electrode,
the first capacitor electrode and one end of the first storage capacitor are electrically connected at least in a first period, and
the second capacitor electrode is connected to the data line.

5. The electro-optical device according to claim 3, further comprising:
a third storage capacitor having one end connected to the data line, wherein the second storage capacitor is connected in series to the first storage capacitor through a first switch, and the second voltage is level-shifted and generated based on the capacitance ratio of at least the second storage capacitor and the third storage capacitor.

6. The electro-optical device according to claim 5, further comprising:

a level shift circuit including the first storage capacitor, the second storage capacitor, and the first switch, and driving the data line, wherein the pixel circuit includes a first transistor supplying current according to the voltage between a gate and a source of the first transistor and a light-emitting element emitting light at a luminance according to the current supplied from the first transistor, wherein the first transistor and the light-emitting element are connected in series between a high order side and a low order side of a power source, and wherein, when viewed from a direction orthogonal with respect to the first main surface, a common wiring electrically connected to the high order side or the low order side is formed so as to cover the level shift circuit, and one electrode of the second portion and the common wiring are electrically connected.

7. The electro-optical device according to claim 6, further comprising:

a second switch having an input end and an output end connected to one end of the first storage capacitor, wherein the data signal is supplied to the input end of the second switch, wherein, when viewed from a direction orthogonal with respect to the first main surface, the common wiring is formed so as to cover the second switch.

8. The electro-optical device according to claim 6, wherein the one electrode of the second portion is a part of the common wiring.

9. The electro-optical device according to claim 6, wherein the pixel circuit includes a second transistor turning on or off between the data line and the gate of the first transistor, and a third transistor turning on or off between the gate and the drain of the first transistor, wherein the driving circuit including the level shift circuit electrically connects the data line and a first power supply line supplying an initial potential and electrically connects the other end of the second storage capacitor and a second power supply line supplying a predetermined potential in a first period;

electrically disconnects the data line and the first power supply line and turns on the second transistor and the third transistor in a state where the connection of the other end of the second storage capacitor and the second power supply line is maintained in a second period after the first period;

electrically disconnects the other end of the second storage capacitor and the second power supply line and supplies a data signal held in the second storage capacitor to the other end of the second storage capacitor in a third period after the second period; and turns off the second transistor after the third period.

10. The electro-optical device according to claim 9, further comprising:

a second switch having an input end and an output end connected to the one end of the first storage capacitor, wherein the data signal is supplied to the input end of the second switch, wherein the second storage capacitor is connected in series to the first storage capacitor through the first switch, the second switch is turned on before the third period in a state where the first switch is turned off, and the first switch is turned on in a state where the second switch is turned off in the third period.

11. The electro-optical device according to claim 3, wherein the second storage capacitor is provided with a third portion and a fourth portion, and, when viewed from a direction orthogonal to the first main surface, the third portion and the fourth portion are formed so as to overlap.

12. The electro-optical device according to claim 11, further comprising:

one electrode of the fourth portion;

a fourth dielectric;

another electrode of the fourth portion facing the one electrode of the fourth portion through the fourth dielectric;

one electrode of the third portion arranged so as to overlap with the other electrode of the fourth portion when viewed from a direction orthogonal to the first main surface and electrically connected to the other electrode of the fourth portion;

a third dielectric; and another electrode of the third portion mutually facing the one electrode of the third portion through the third dielectric and electrically connected to the one electrode of the fourth portion.

13. The electro-optical device according to claim 12, wherein the other electrode of the fourth portion and the one electrode of the third portion are formed as a common electrode.

14. The electro-optical device according to claim 1, wherein the substrate is a semiconductor substrate.

15. An electronic apparatus comprising the electro-optical device of claim 1.

16. An electro-optical device comprising:

a substrate;

a scanning line provided on an upper side of a first main surface of the substrate;

a data line provided on the upper side of the first main surface;

a pixel circuit provided corresponding to an intersection of the scanning line and the data line;

a first storage capacitor holding a first voltage corresponding to a data signal, the first storage capacitor including a first portion and a second portion connected in parallel, and the first portion and the second portion overlapping when viewed from a direction orthogonal with respect to the first main surface;

one electrode of the second portion;

a second dielectric;

another electrode of the second portion facing the one electrode of the second portion through the second dielectric;

one electrode of the first portion arranged so as to overlap with the other electrode of the second portion when viewed from a direction orthogonal to the first main surface and electrically connected to the other electrode of the second portion;

a first dielectric; and another electrode of the first portion facing the one electrode of the first portion through the first dielectric and electrically connected to the one electrode of the second portion.

17. The electro-optical device according to claim 16,
wherein the other electrode of the second portion and the one electrode of the first portion are formed as a common electrode.

18. An electro-optical device, comprising:
a substrate;
a scanning line provided on an upper side of a first main surface of the substrate;
a data line provided on the upper side of the first main surface;
a pixel circuit provided corresponding to an intersection of the scanning line and the data line; and
a first storage capacitor holding a first voltage corresponding to a data signal,
wherein the first storage capacitor includes a first portion and a second portion connected in parallel,
the first portion includes a first capacitor electrode and a second capacitor electrode,
the second portion includes a third capacitor electrode and a fourth capacitor electrode, and
the first capacitor electrode and the third capacitor electrode overlap when viewed from a direction orthogonal with respect to the first main surface.

19. The electro-optical device according to claim 18, further comprising:
a second storage capacitor having one end connected to the data line; and
a third storage capacitor connected to the data line,
wherein the second storage capacitor includes a fifth capacitor electrode and a sixth capacitor electrode,
the pixel circuit includes a pixel capacitor holding a second voltage according to the data signal,
the second voltage is generated based on the first voltage,
the fifth capacitor electrode and one end of the first storage capacitor are electrically connected in at least the first period,
the sixth capacitor electrode is connected to the data line, and
the second voltage is generated by capacitance division of the first voltage with at least the second storage capacitor and the third storage capacitor.

* * * * *